(12) United States Patent  
Pachamuthu et al.

(10) Patent No.: US 12,354,678 B2
(45) Date of Patent: Jul. 8, 2025

(54) NON-VOLATILE MEMORY WITH EFFICIENT TESTING

(71) Applicant: SANDISK TECHNOLOGIES LLC, Addison, TX (US)

(72) Inventors: Jayavel Pachamuthu, San Jose, CA (US); Dana Lee, Saratoga, CA (US); Jiahui Yuan, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 573 days.

(21) Appl. No.: 17/729,331

(22) Filed: Apr. 26, 2022

(65) Prior Publication Data
US 2023/0058836 A1 Feb. 23, 2023

Related U.S. Application Data

(63) Continuation-in-part of application No. 17/403,052, filed on Aug. 16, 2021, now Pat. No. 11,657,884.

(51) Int. Cl.
*G11C 16/34* (2006.01)
*G11C 16/08* (2006.01)
(Continued)

(52) U.S. Cl.
CPC .......... *G11C 16/3445* (2013.01); *G11C 16/08* (2013.01); *G11C 16/102* (2013.01);
(Continued)

(58) Field of Classification Search
CPC ... G11C 16/3445; G11C 16/08; G11C 16/102; G11C 16/16; G11C 16/26;
(Continued)

(56) References Cited

U.S. PATENT DOCUMENTS 9,704,596 B1 7/2017 Shim
10,037,812 B2 7/2018 Shibata
(Continued)

OTHER PUBLICATIONS

PCT International Preliminary Report on Patentability, International Application No. PCT/US2022/028225, dated Feb. 13, 2024.
(Continued)

*Primary Examiner* — Jay W. Radke
(74) *Attorney, Agent, or Firm* — PEARL COHEN ZEDEK LATZER BARATZ LLP

(57) ABSTRACT

A non-volatile memory system performs an erase process followed by a program process to program blocks of memory cells. The erase process comprises erasing followed by erase verification. The system recovers data and records a strike for blocks that fail a read process. In response to a particular block having a strike, the system performs an odd/even compare process during the erase process for the particular blocks having the strike such that the odd/even compare process comprises determining whether a number of memory cells connected to even word lines that have a different erase verify result than memory cells connected to odd word lines is greater than a defect test threshold. The system retires blocks from further use for storing host data that fail the odd/even compare process even if the block passes erase verification.

19 Claims, 25 Drawing Sheets

(51) Int. Cl.
*G11C 16/10* (2006.01)
*G11C 16/16* (2006.01)
*G11C 16/26* (2006.01)

(52) U.S. Cl.
CPC .............. *G11C 16/16* (2013.01); *G11C 16/26* (2013.01); *G11C 16/3459* (2013.01)

(58) Field of Classification Search
CPC . G11C 16/3459; G11C 11/5628; G11C 16/10; G11C 16/0483
See application file for complete search history.

(56) References Cited

U.S. PATENT DOCUMENTS

| | | | |
|---|---|---|---|
| 10,186,326 B2 | 1/2019 | Takizawa | |
| 11,011,237 B2 | 5/2021 | Tsuda | |
| 11,309,041 B2 | 4/2022 | Li et al. | |
| 11,657,884 B2* | 5/2023 | Pachamuthu | G11C 16/08 365/185.22 |
| 11,810,628 B2* | 11/2023 | Pachamuthu | G11C 16/24 |
| 2008/0198662 A1 | 8/2008 | Mokhlesi | |
| 2010/0199150 A1 | 8/2010 | Shalvi et al. | |
| 2014/0075252 A1 | 3/2014 | Luo et al. | |
| 2018/0196622 A1 | 7/2018 | Oshimi et al. | |
| 2020/0005873 A1 | 1/2020 | Yazovitsky et al. | |
| 2020/0091169 A1 | 3/2020 | Tokutomi | |
| 2021/0280260 A1 | 9/2021 | Shino | |

OTHER PUBLICATIONS

Response to Office Action filed Feb. 3, 2023, U.S. Appl. No. 17/403,052.
Notice of Allowance mail date Apr. 3, 2023, U.S. Appl. No. 17/403,052.
PCT International Search Report and Written Opinion dated Sep. 30, 2022, PCT Patent Application No. PCT/US2022/028225.
U.S. Appl. No. 17/403,052, filed Aug. 16, 2021, "Non-Volatile Memory With Efficient Testing During Erase".
Office Action dated Nov. 3, 2022, U.S. Appl. No. 17/403,052.

* cited by examiner

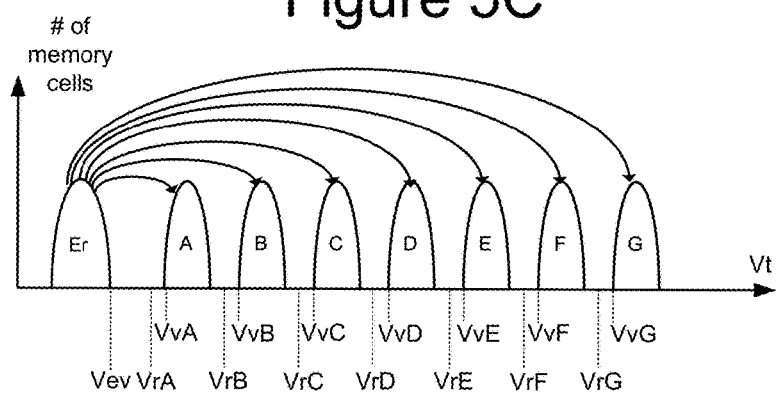
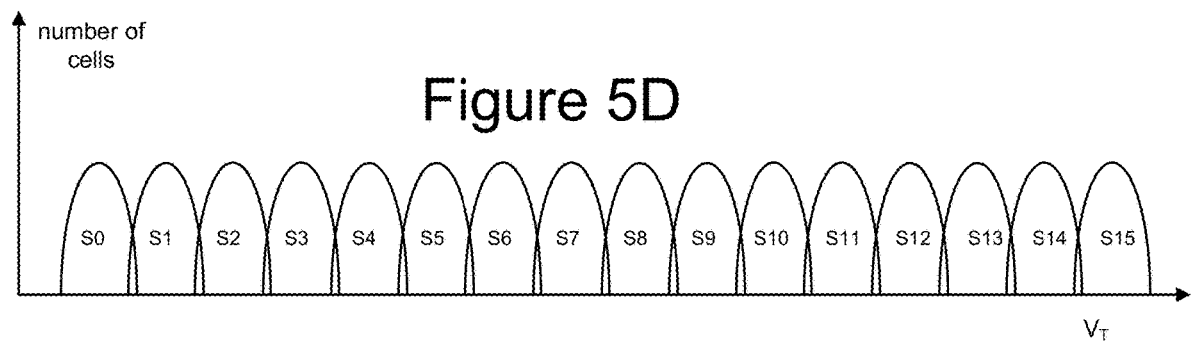

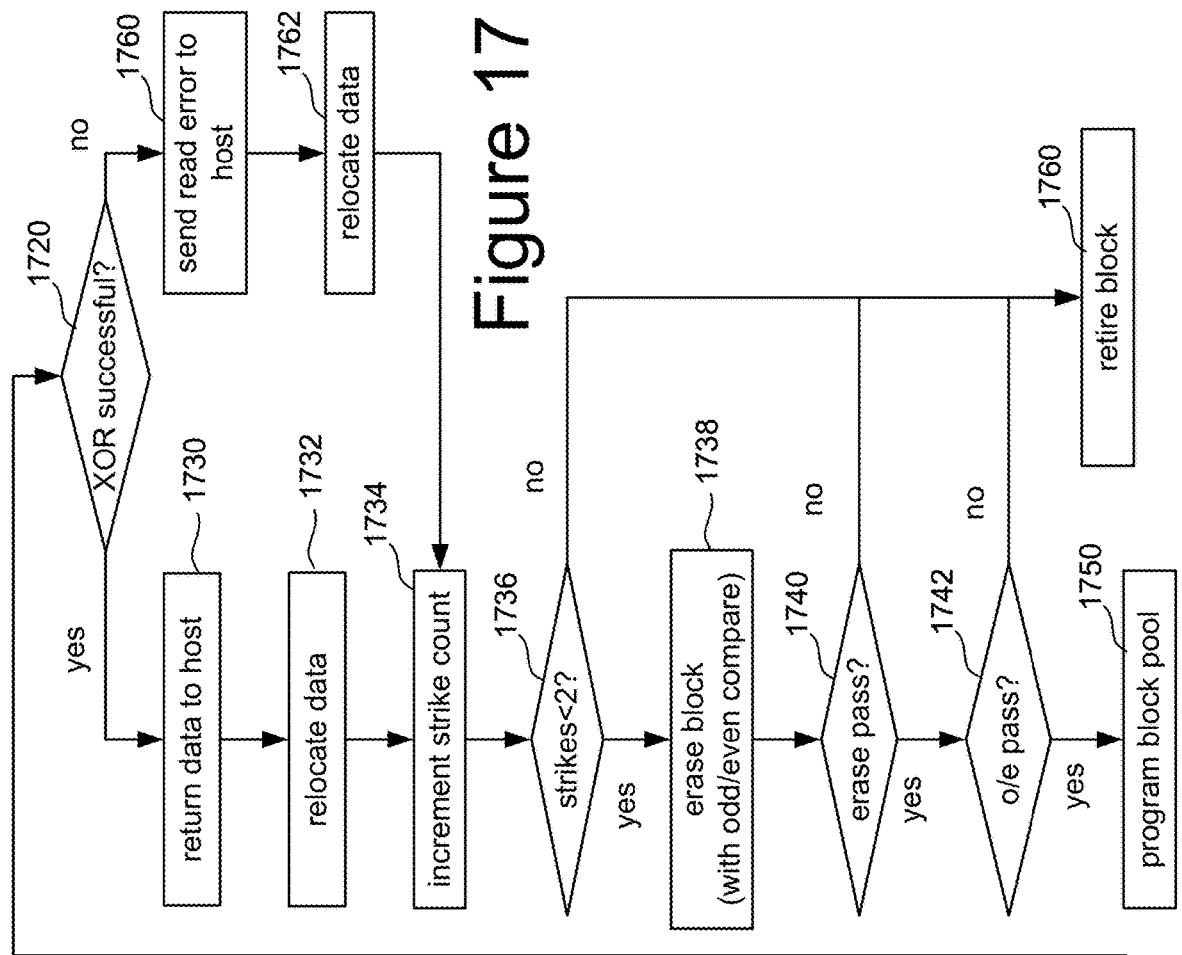
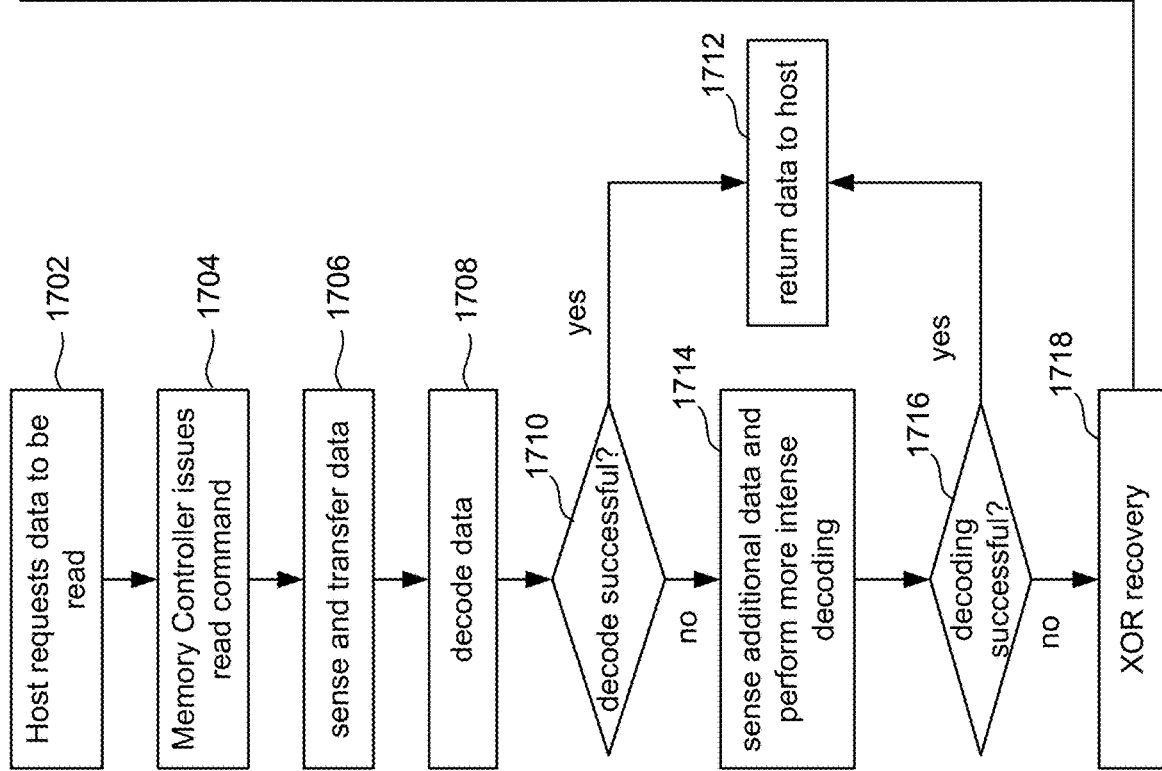
Figure 17

NON-VOLATILE MEMORY WITH EFFICIENT TESTING

This application claims priority from and is a Continuation-In-Part of U.S. patent application Ser. No. 17/403,052, "Non-Volatile Memory With Efficient Testing During Erase," filed Aug. 16, 2021, incorporated herein by reference in its entirety.

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that the data can be read back successfully.

A defect in a non-volatile memory (e.g., a short or leak between a word line and the channel) can introduce an error into the data being stored. Sometimes a defect appears at the time of manufacturing and sometimes the defect appears during use of the non-volatile memory. To prevent failures of the non-volatile memory when in use due to defects that first present during operation by a user, manufacturers of non-volatile memory include various processes for testing the memory in an effort to detect defects before the non-volatile memory is used to store data. However, users of non-volatile memory want high performance, including fast operational speeds. Therefore, it is desirable for the testing of the memory for defects to use as little time as possible in order to not degrade memory performance.

BRIEF DESCRIPTION OF THE DRAWINGS

Like-numbered elements refer to common components in the different figures.

FIG. 5C depicts threshold voltage distributions.

FIG. 5D depicts threshold voltage distributions.

FIG. 17 is a flow chart describing one embodiment of a process for reading data that includes testing for defects in response to a failed read process.

DETAILED DESCRIPTION

A non-volatile memory system is proposed that performs erase verify for groups of connected memory cells (e.g., NAND strings) between and after doses of an erase signal including separately performing erase verify for memory cells connected to even word lines to generate an even result for each group and performing erase verify for memory cells connected to odd word lines to generate an odd result for each group. The even results and the odd results are used to determine if the erase verify process indicates that the erasing has successfully completed. In addition, for each group of connected memory cells, a last even result for the group of connected memory cells is compared with a last odd result for the group of connected memory cells. Even if the erase verify indicated that the erasing has successfully completed, the system may still determine that the erasing has failed (i.e. due to existence of a defect) if the number of groups of connected memory cells that have the last even result different from the last odd result is greater than a limit.

By using the results of the erase verify to identify defects, the memory system does not slow down the erase process in order to perform extra sensing operations. This testing can be performed prior to programming data to blocks that have already experienced a failed read process or in response to a failed read process.

Figure 1:
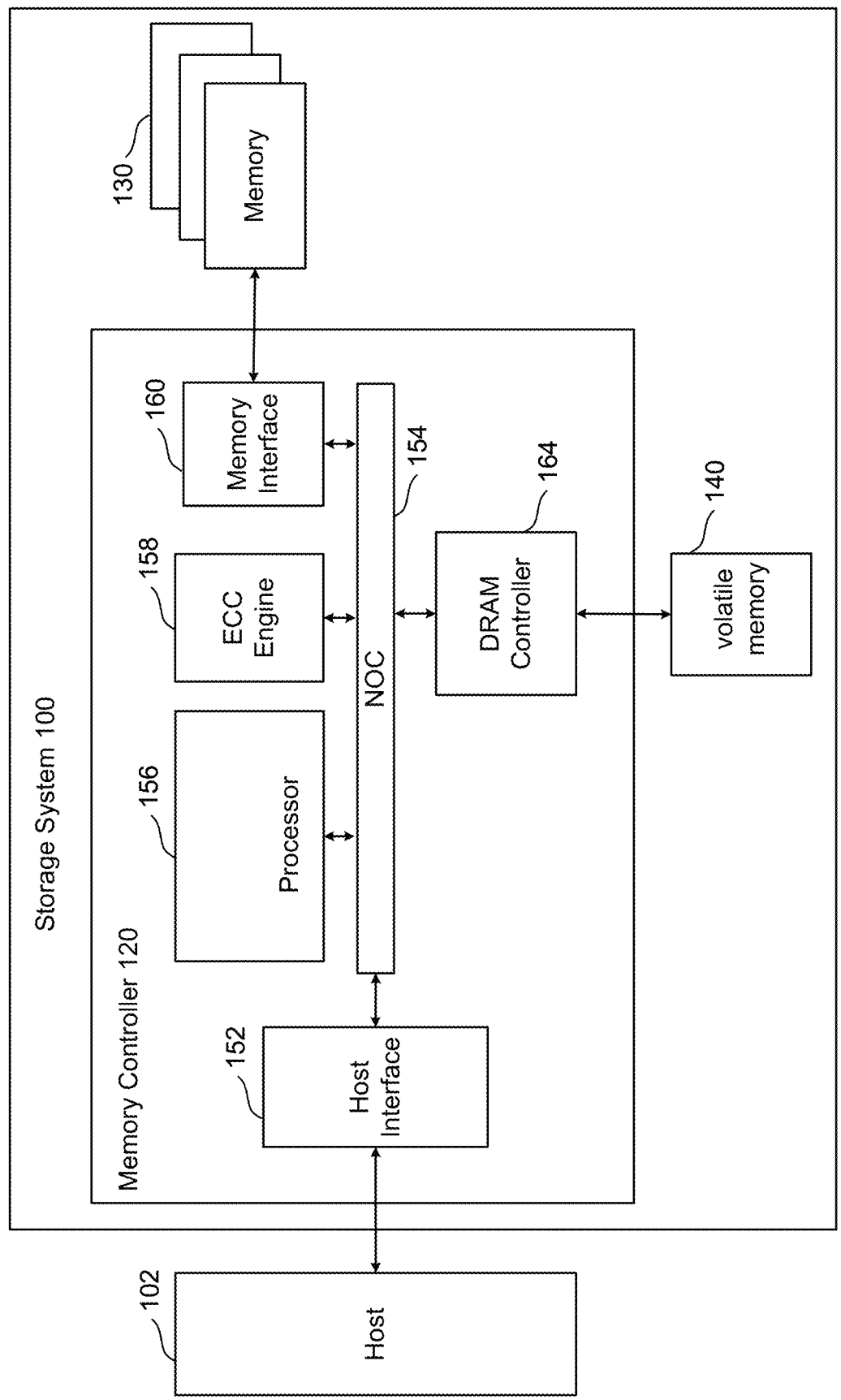
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
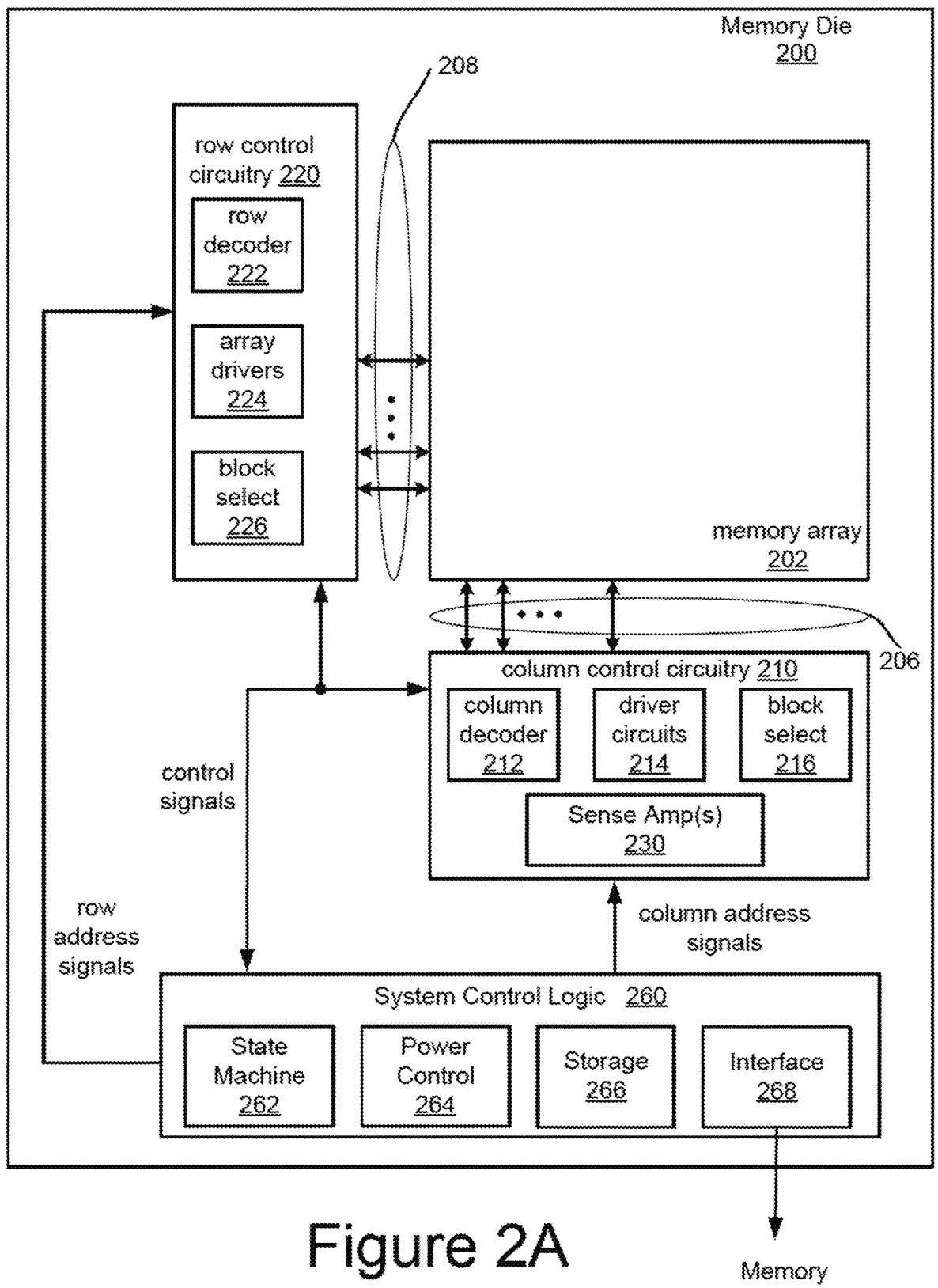
FIG. 2A is a block diagram of one embodiment of a memory die.

In one embodiment, non-volatile memory 130 comprises one or more memory die. FIG. 2A is a functional block diagram of one embodiment of a memory die 200 that is included in non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuit for creating regulating voltages. System control logic 260 includes storage 266 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that is monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
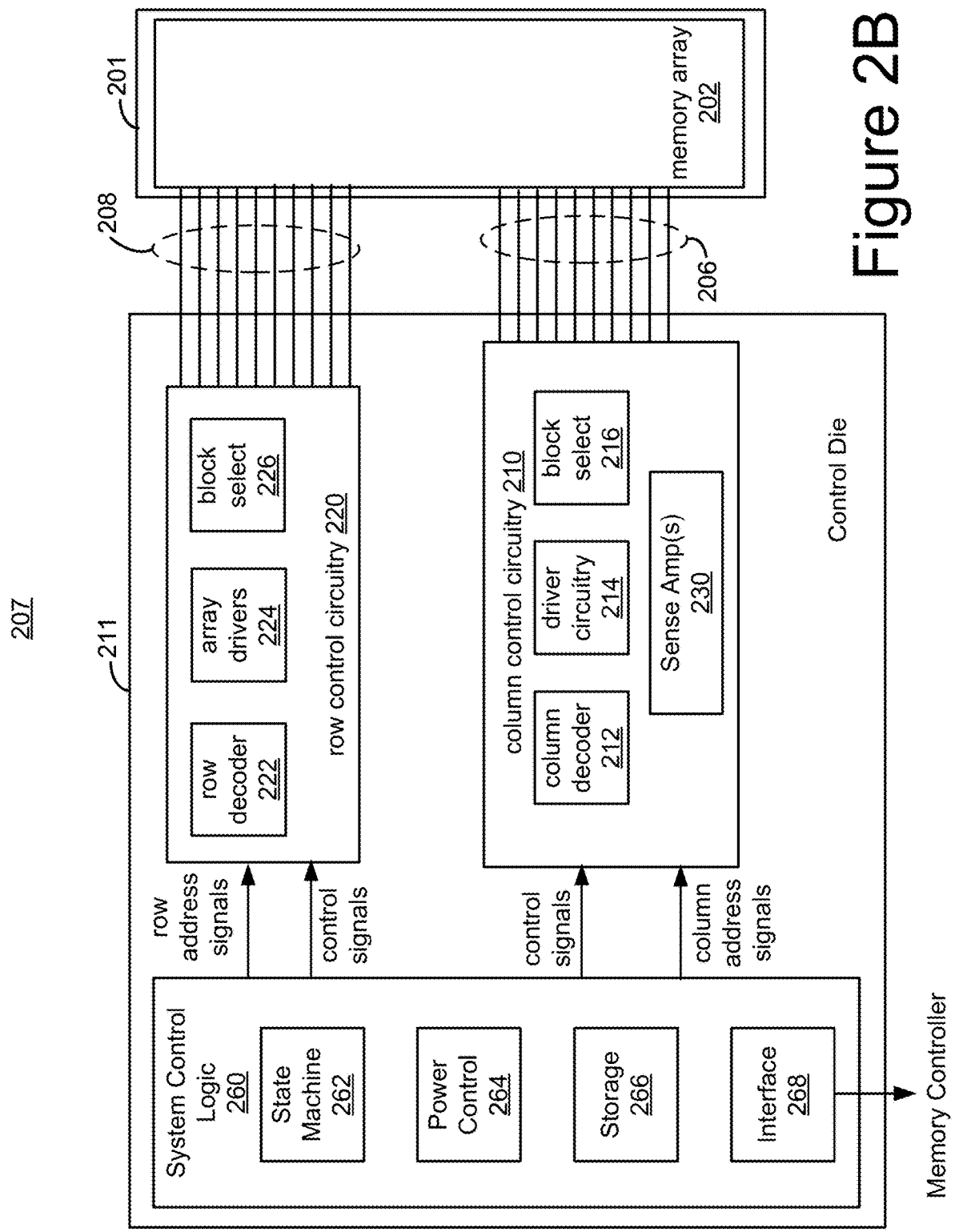
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 2C:
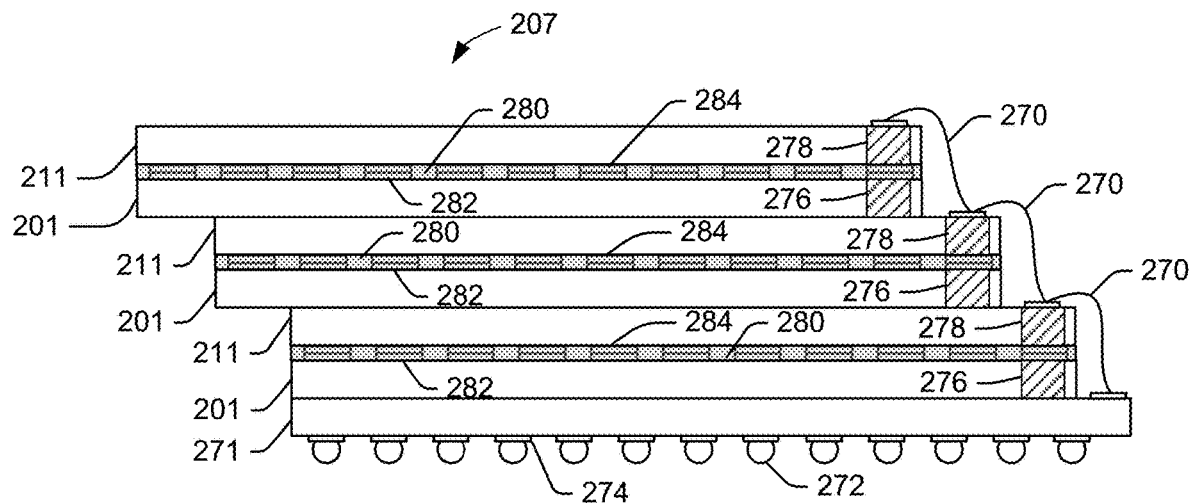
FIGS. 2C and 2D depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 2C depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
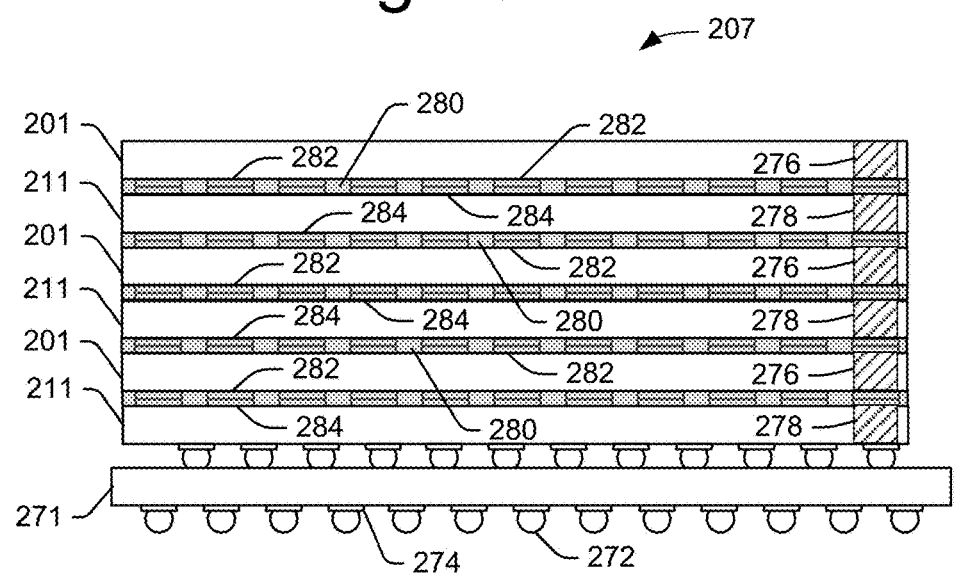

FIG. 2D depicts a side view of another embodiment of an integrated memory assembly 207 stacked on a substrate 271. The integrated memory assembly 207 of FIG. 2D has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 3:
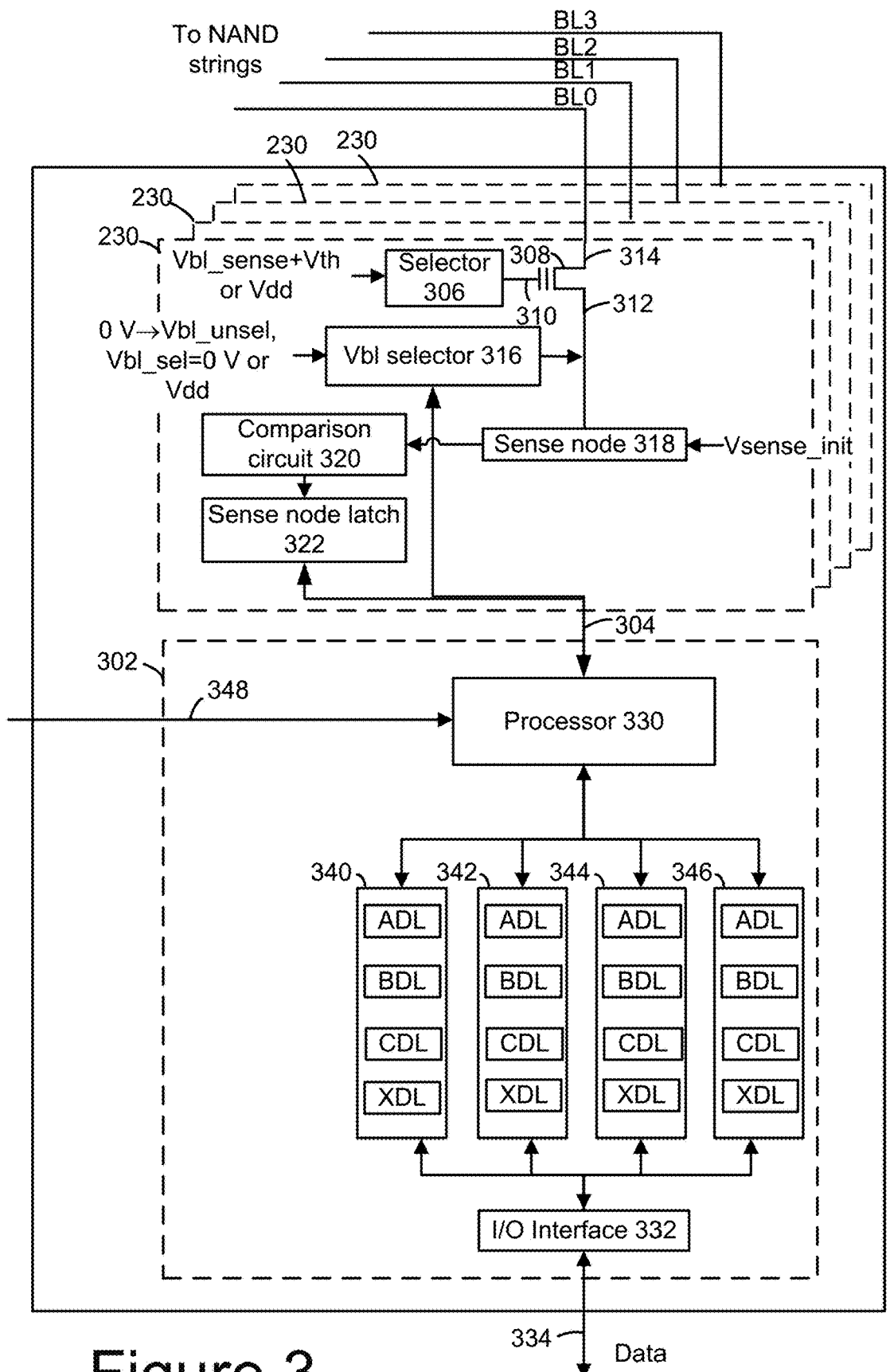
FIG. 3 depicts circuitry used to sense data from non-volatile memory.

FIG. 3 is a block diagram depicting one embodiment of a portion of column control circuitry 210 that is partitioned into a plurality of sense amplifiers 230, and a common portion, referred to as a managing circuit 302. In one embodiment, each sense amplifier 230 is connected to a respective bit line which in turn is connected to one or more NAND strings. In one example implementation, each bit line is connected to six NAND strings, with one NAND string per sub-block. Managing circuit 302 is connected to a set of multiple (e.g., four, eight, etc.) sense amplifiers 230. Each of the sense amplifiers 230 in a group communicates with the associated managing circuit via data bus 304.

Each sense amplifier 230 operates to provide voltages to bit lines (see BL0, BL1, BL2, BL3) during program, verify, erase and read operations. Sense amplifiers are also used to sense the condition (e.g., data state) to a memory cells in a NAND string connected to the bit line that connects to the respective sense amplifier.

Each sense amplifier 230 includes a selector 306 or switch connected to a transistor 308 (e.g., an nMOS). Based on voltages at the control gate 310 and drain 312 of the transistor 308, the transistor can operate as a pass gate or as a bit line clamp. When the voltage at the control gate is sufficiently higher than the voltage on the drain, the transistor operates as a pass gate to pass the voltage at the drain to the bit line (BL) at the source 314 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 306 may pass a power supply voltage Vdd, (e.g., 3-4 V) to the control gate of the transistor 308 to cause it to operate as a pass gate.

When the voltage at the control gate is lower than the voltage on the drain, the transistor 308 operates as a source-follower to set or clamp the bit line voltage at Vcg-Vth, where Vcg is the voltage on the control gate 310 and Vth, e.g., 0.7 V, is the threshold voltage of the transistor 308. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 310 is referred to as a bit line clamp voltage, Vblc. This mode can be used during sensing operations such as read and verify operations. The bit line voltage is thus set by the transistor 308 based on the voltage output by the selector 306. For example, the selector 306 may pass Vsense+Vth, e.g., 1.5 V, to the control gate of the transistor 308 to provide Vsense, e.g., 0.8 V, on the bit line. A Vbl selector 316 may pass a relatively high voltage such as Vdd to the drain 312, which is higher than the control gate voltage on the transistor 308, to provide the source-follower mode during sensing operations. Vbl refers to the bit line voltage.

The Vbl selector 316 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 316 can pass a program-enable voltage signal such as 0 V for respective bit lines of selected NAND strings during a program loop.

In one approach, the selector 306 of each sense circuit can be controlled separately from the selectors of other sense circuits. The Vbl selector 316 of each sense circuit can also be controlled separately from the Vbl selectors of other sense circuits.

During sensing, a sense node 318 is charged up to an initial voltage, Vsense_init, such as 3 V. The sense node is then passed to the bit line via the transistor 308, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 320 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation. The bit in the sense node latch 322 can also be used in a lockout scan to decide whether to set a bit line voltage to an inhibit or program level in a next program loop. L Managing circuit 302 comprises a processor 330, four example sets of data latches 340, 342, 344 and 346, and an I/O interface 332 coupled between the sets of data latches and the data bus 334. FIG. 3 shows four example sets of data latches 340, 342, 344 and 346; however, in other embodiments more or less than four can be implemented. In one embodiment, there is one set of latches for each sense amplifier 230. One set of three data latches, e.g., comprising individual latches ADL, BDL, CDL and XDL, can be provided for each sense circuit. In some cases, a different number of data latches may be used. In a three bit per memory cell embodiment, ADL stores a bit for a lower page of data, BDL stores a bit for a middle page of data, CDL stores a bit for an upper page of data and XDL serves as an interface latch for storing/latching data from the memory controller.

Processor 330 performs computations, such as to determine the data stored in the sensed memory cell and store the determined data in the set of data latches. Each set of data latches 340-346 is used to store data bits determined by processor 330 during a read operation, and to store data bits imported from the data bus 334 during a program operation which represent write data meant to be programmed into the memory. I/O interface 332 provides an interface between data latches 340-346 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to processor 330 via the data bus 304. At that point, processor 330 determines the resultant memory state by consideration of the tripping event(s) of the sense circuit and the information about the applied control gate voltage from the state machine via input lines 348. It then computes a binary encoding for the memory state and stores the resultant data bits into data latches 340-346.

Some implementations can include multiple processors 330. In one embodiment, each processor 330 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 330 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 340-346 from the data bus 334. During reprogramming, a respective set of data latches of a memory cell can store data indicating when to enable the memory cell for reprogramming based on the program pulse magnitude.

The program operation, under the control of the state machine 262, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 330 monitors the read back memory state relative to the desired memory state. When the two are in agreement, processor 330 sets the bit line in a program inhibit mode such as by updating its latches. This inhibits the memory cell coupled to the bit line from further programming even if additional program pulses are applied to its control gate.

Figure 4:
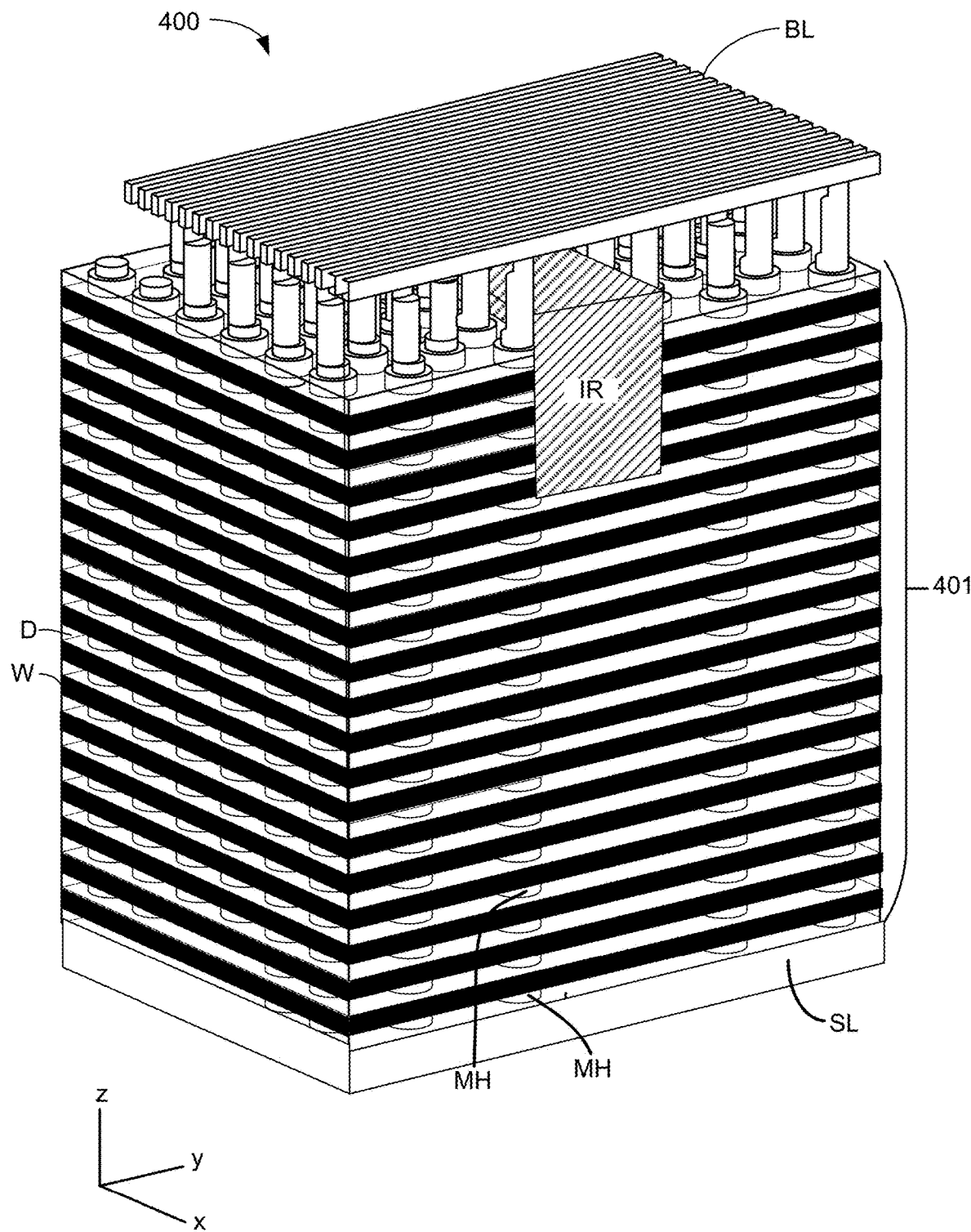
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into five (or a different number of) regions (also referred to as sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
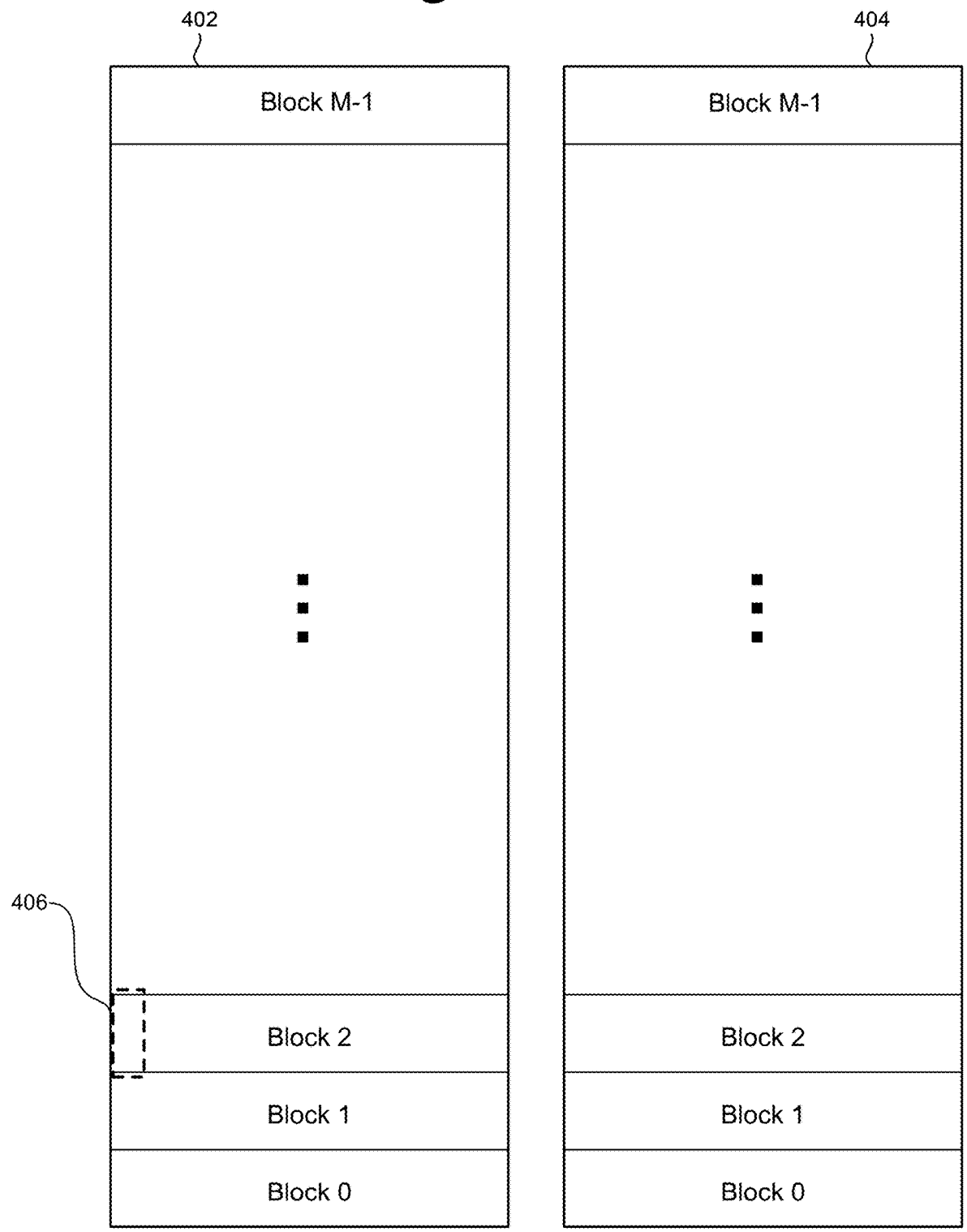
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory structure 202 includes eight planes.

Figure 4B:
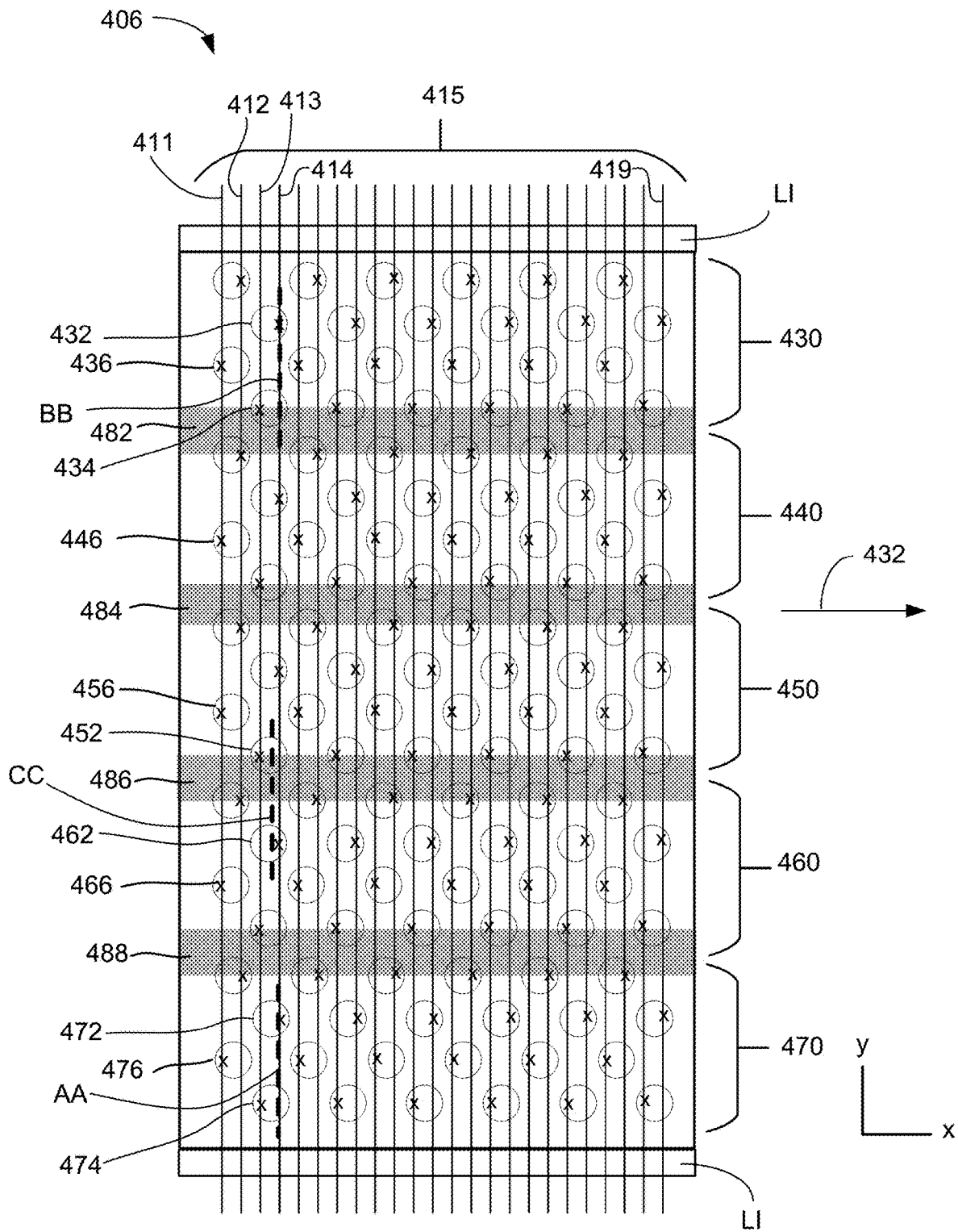
FIG. 4B depicts a top view of a portion of one embodiment of a block of memory cells.

FIGS. 4B-4G depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 436, 446, 456, 466 and 476.

The block depicted in FIG. 4B includes a set of isolation regions 482, 484, 486 and 488, which are formed of $SiO_2$; however, other dielectric materials can also be used. Isolation regions 482, 484, 486 and 488 serve to divide the top layers of the block into five regions; for example, the top layer depicted in FIG. 4B is divided into regions 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line connects to one vertical column/NAND string in each of regions (sub-blocks) 430, 440, 450, 460 and 470. In that implementation, each block has twenty four rows of active columns and each bit line connects to five rows in each block. In one embodiment, all of the five vertical columns/NAND strings connected to a common bit line are connected to the same set of word lines; therefore, the system uses the drain side selection lines to choose one (or another subset) of the five to be subjected to a memory operation (program, verify, read, and/or erase).

FIG. 4B also shows Line Interconnects LI, which are metal connections to the source line SL from above the memory array. Line Interconnects LI are positioned adjacent regions 430 and 470.

Although FIG. 4B shows each region 430, 440, 450, 460 and 470 having four rows of vertical columns, five regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
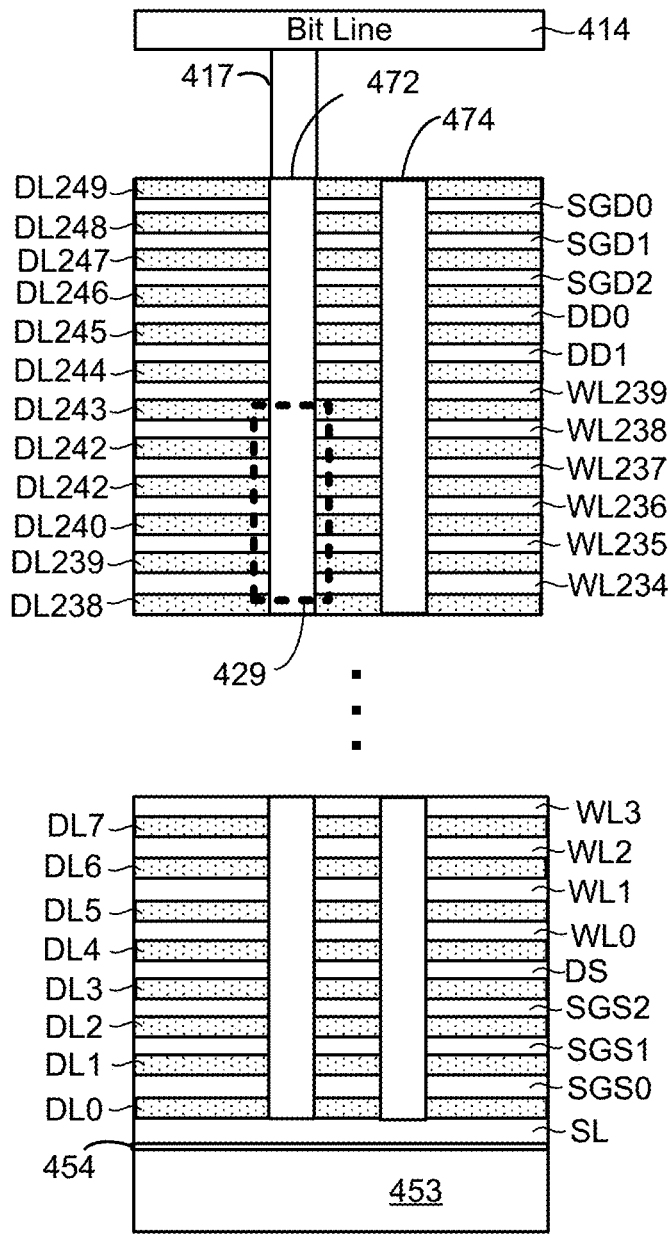
FIG. 4C depicts a cross sectional view of a portion of one embodiment of a block of memory cells.

FIG. 4C depicts a portion of one embodiment of a three dimensional memory structure 202 showing a cross-sectional view along dashed line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; three dummy word line layers DD0, DD1, and DDS; two hundred and forty word line layers WL0-WL239 for connecting to data memory cells, and two hundred and fifty dielectric layers DL0-DL249. Other embodiments can implement more or less than the numbers described above for FIG. 4C. In one embodiment, SGD0, SGD1 and SGD2 are connected together; and SGS0, SGS1 and SGS2 are connected together. In other embodiments, more or less number of SGDs (greater or lesser than three) are connected together, and more or less number of SGSs (greater or lesser than three) connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 472 has a source end at a bottom of the stack and a drain end at a top of the stack. As in agreement with FIG. 4B, FIG. 4C show vertical column 472 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Figure 4D:
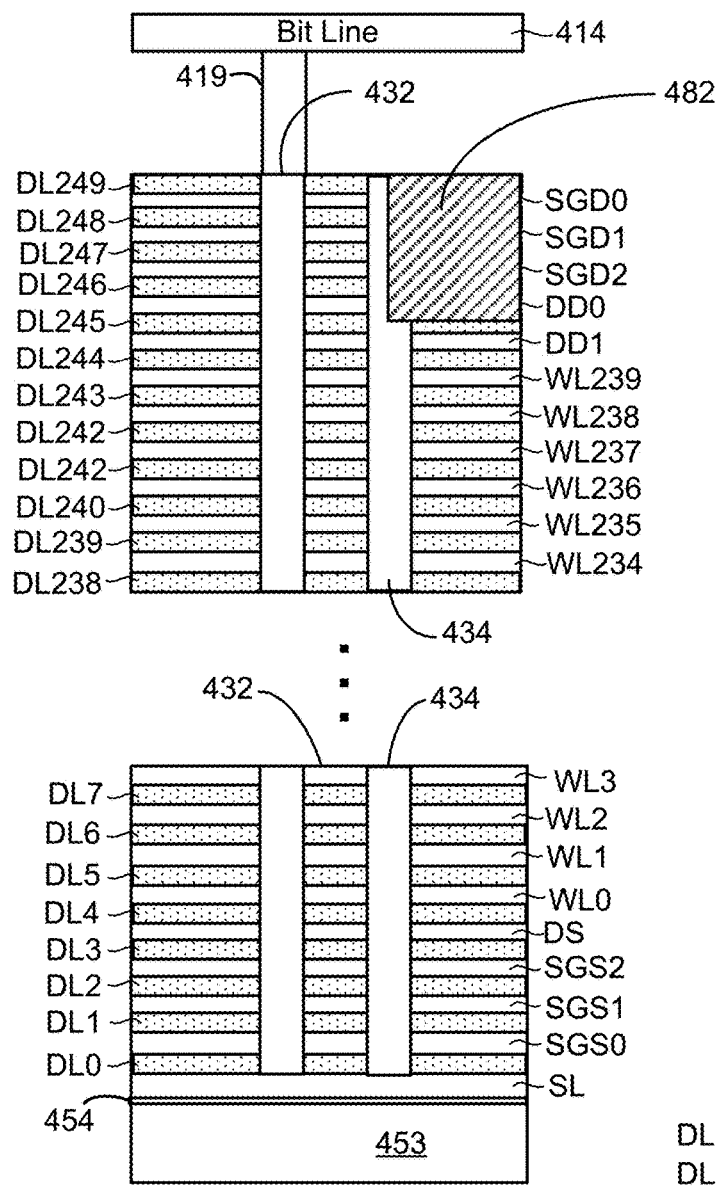
FIG. 4D depicts a cross sectional view of a portion of one embodiment of a block of memory cells.

FIG. 4D depicts a portion of one embodiment of a three dimensional memory structure 202 showing a cross-sectional view along dashed line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 482, 484, 486 and 488) occupy space that would have been used for a portion of the memory holes/vertical columns/NAND stings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with SiO2.

Figure 4E:
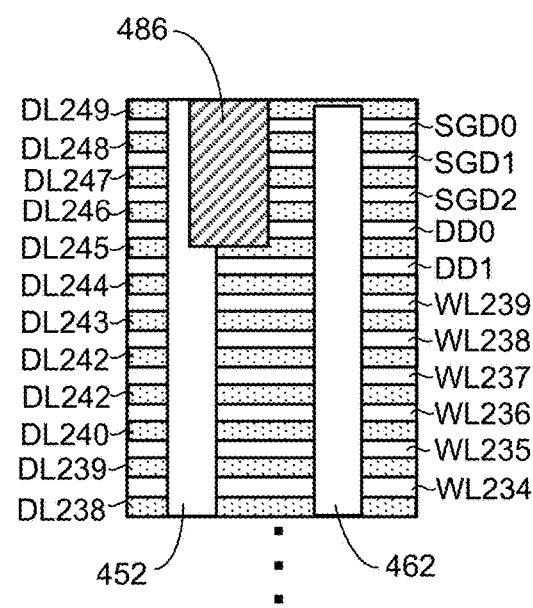
FIG. 4E depicts a cross sectional view of a portion of one embodiment of a block of memory cells.

FIG. 4E depicts a portion of one embodiment of a three dimensional memory structure 202 showing a cross-sectional view along dashed line CC of FIG. 4B. This cross sectional view cuts through vertical columns (NAND strings) 452 and 462 (see FIG. 4B). FIG. 4E shows the same alternating conductive and dielectric layers as FIG. 4C. FIG. 4E also shows isolation region 486 cutting into vertical columns (NAND string) 452.

FIG. 4E depicts a portion of one embodiment of a three dimensional memory structure 202 showing a cross-sectional view along line CC of FIG. 4B. This cross sectional view cuts through vertical columns (NAND strings) 452 and 4624 (see FIG. 4B). FIG. 4E shows the same alternating conductive and dielectric layers as FIG. 4C. FIG. 4E also shows isolation region 486 cutting into vertical columns (NAND string) 452.

Figure 4F:
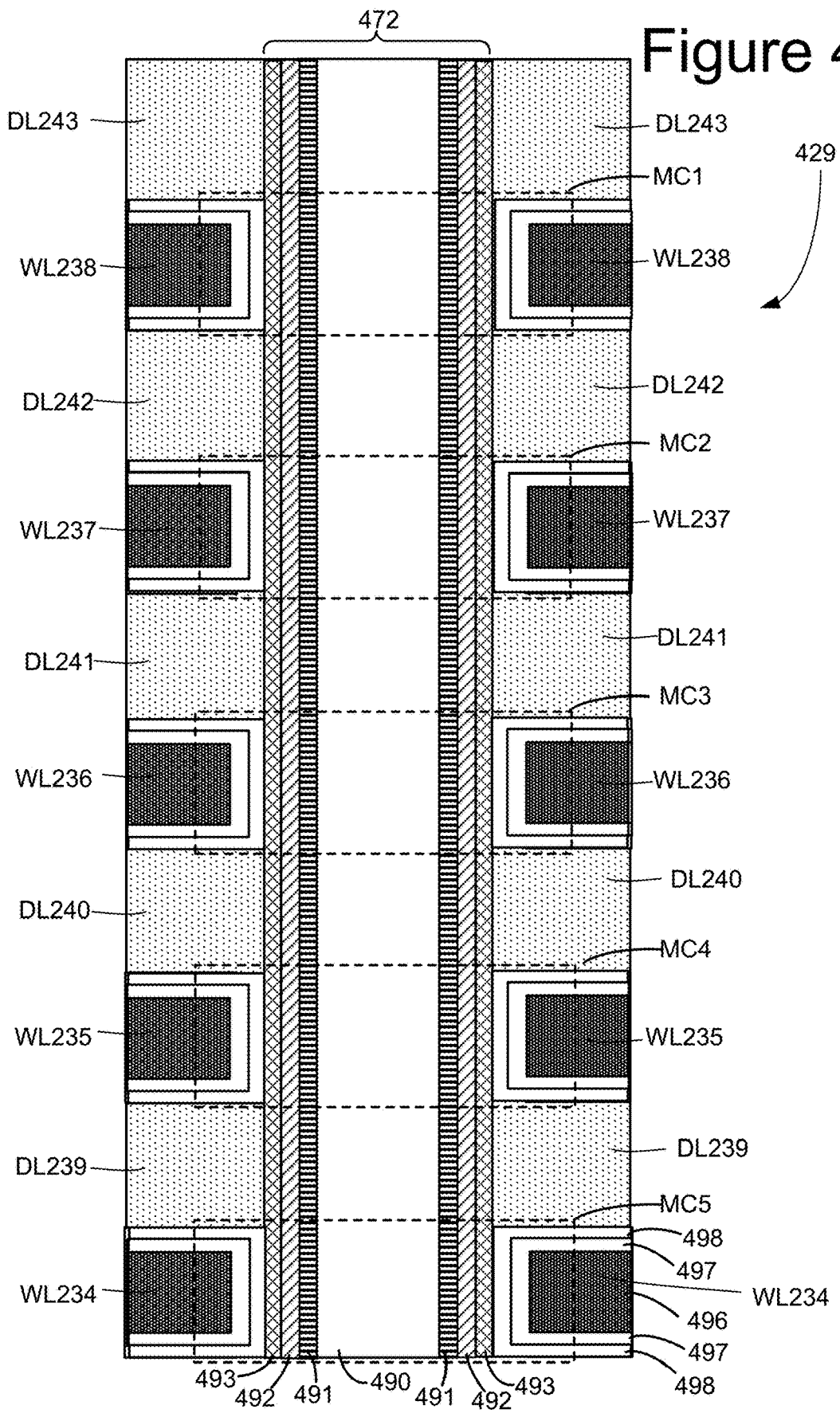
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DL239, DL240, DL241, DL242 and DL243, as well as word line layers WL234, WL235, WL236, WL237, and WL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL238 and a portion of vertical column 472 comprise a memory cell MC1. Word line layer WL237 and a portion of vertical column 472 comprise a memory cell MC2. Word line layer WL236 and a portion of vertical column 472 comprise a memory cell MC3. Word line layer WL235 and a portion of vertical column 472 comprise a memory cell MC4. Word line layer WL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
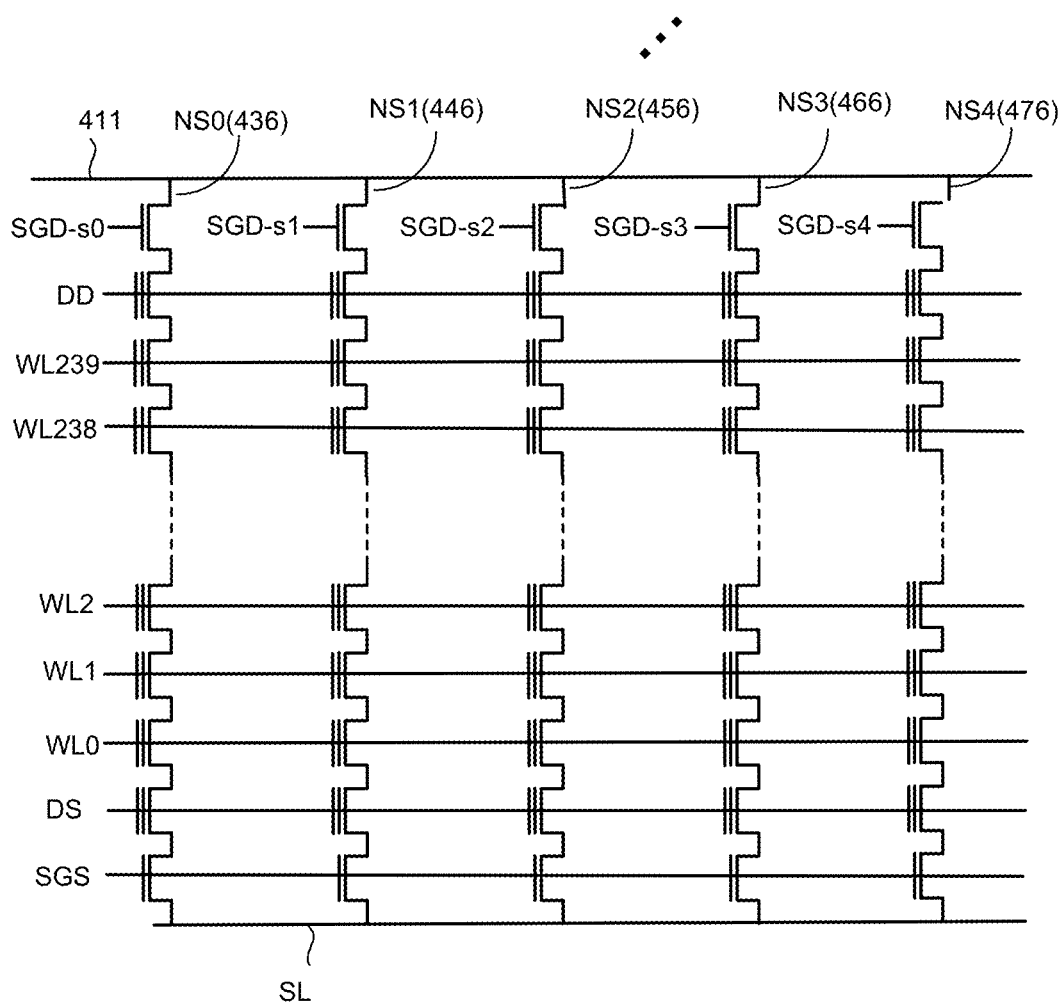
FIG. 4G is a schematic of a plurality of NAND strings in multiple sub-blocks of a same block.

FIG. 4G is a schematic diagram of a portion of the memory array 202 depicted in in FIGS. 4-4F. FIG. 4G shows physical data word lines WL0-WL239 running across the entire block. The structure of FIG. 4G corresponds to a portion 406 in Block 2 of FIG. 4A, including bit line 411. Within the block, in one embodiment, each bit line is connected to five NAND strings. Thus, FIG. 4G shows bit line connected to NAND string NS0 (which corresponds to vertical column 436), NAND string NS1 (which corresponds to vertical column 446), NAND string NS2 (which corresponds to vertical column 456), NAND string NS3 (which corresponds to vertical column 466), and NAND string NS4 (which corresponds to vertical column 476). As mentioned above, in one embodiment, SGD0, SGD1 and SGD2 are connected together to operate as a single logical select gate for each sub-block separated by isolation regions (482, 484, 486 and 488) to form SGD-s0, SGD-s1, SGD-s2, SGD-s3, and SGD-s4. SGS0, SGS1 and SGS2 are also connected together to operate as a single logical select gate that is represented in FIG. 4G as SGS. Although the select gates SGD-s0, SGD-s1, SGD-s2, SGD-s3, and SGD-s4 are isolated from each other due to the isolation regions, the data word lines WL0-WL239 of each sub-block are connected together.

The isolation regions (482, 484, 486 and 488) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4.

FIG. 4G only shows NAND strings connected to bit line 411. However, a full schematic of the block would show every bit line and five vertical NAND strings (that are in separate sub-blocks) connected to each bit line.

Although the example memories of FIGS. 4-4G are three dimensional memory structure that includes vertical NAND strings with charge-trapping material, other (2D and 3D) memory structures can also be used with the technology described herein.

Figure 5A:
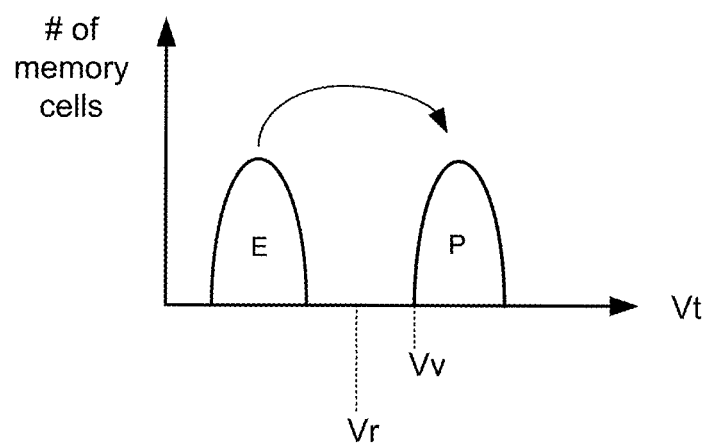
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Figure 5B:
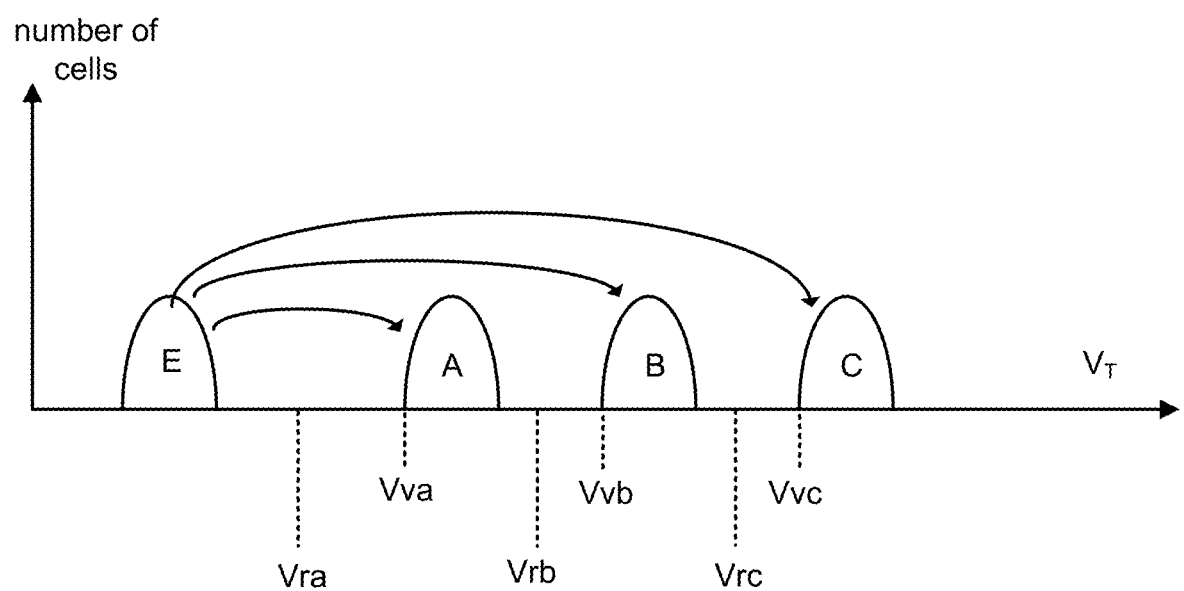
FIG. 5B depicts threshold voltage distributions.

FIGS. 5B-D illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, or five bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state Er to data state A, other memory cells are being programmed from data state Er to data state B and/or from data state Er to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 5C) or verify operation (e.g. see verify target levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 6:
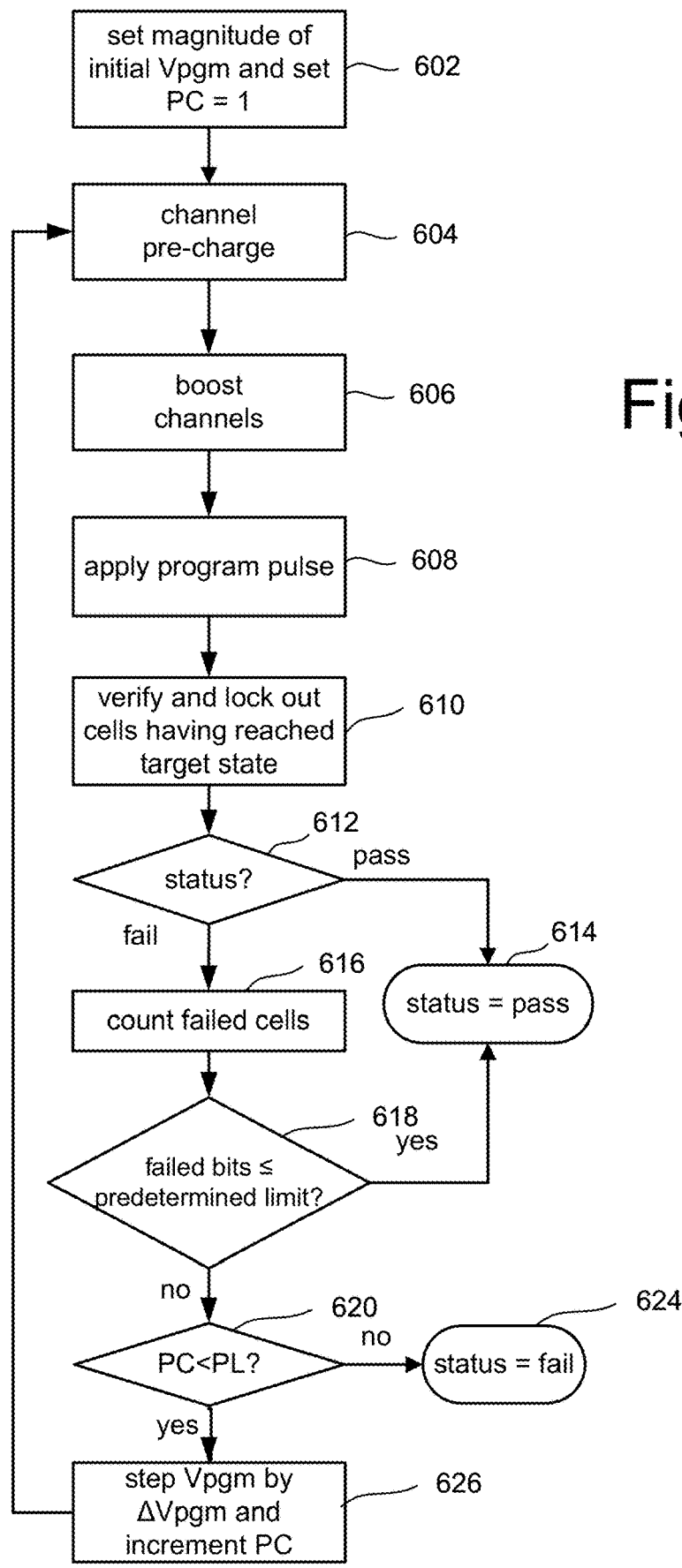
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, then the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, then the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In one embodiment memory cells are erased prior to programming. Erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor—SGD) that is connected to or near a bit line to generate a first GIDL current. A second GIDL voltage may be created between two terminals of a select transistor (e.g., source side select transistor—SGS) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7:
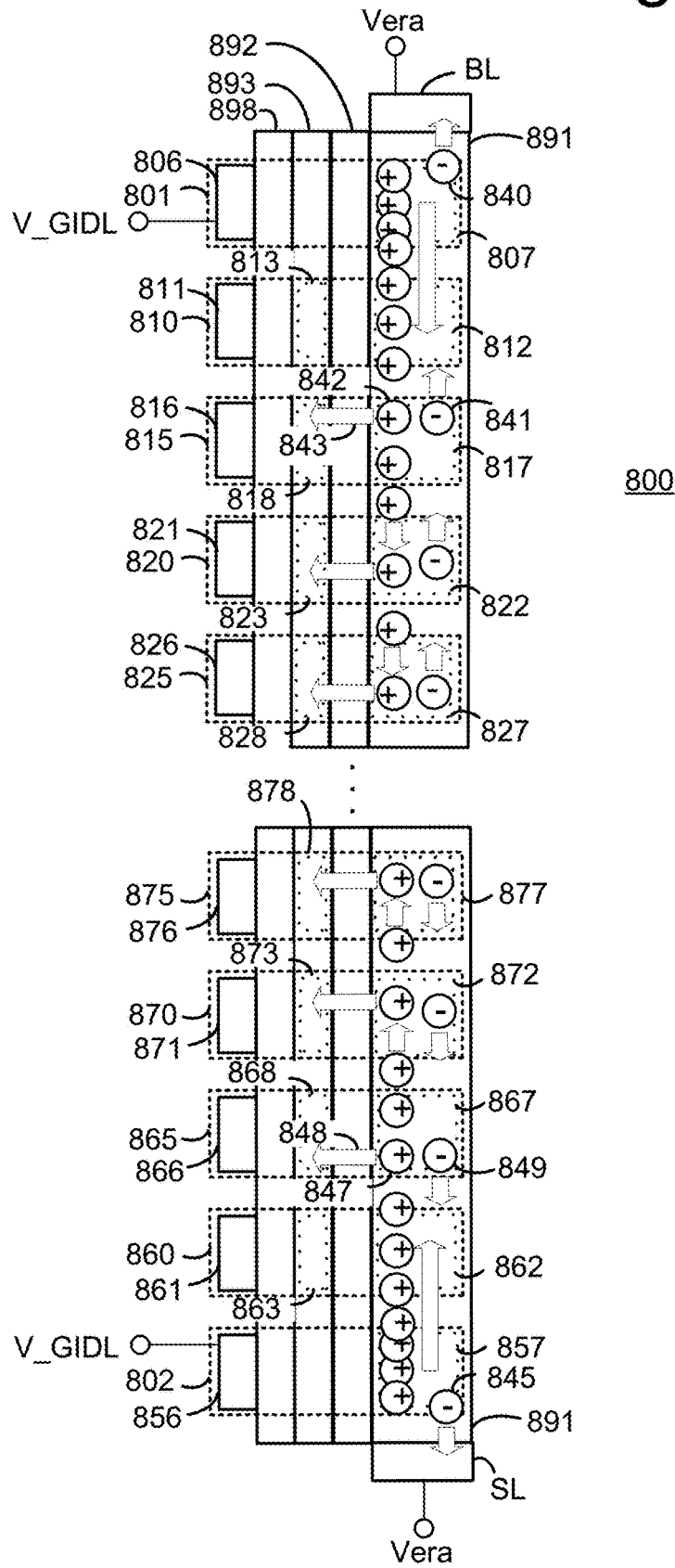
FIG. 7 depicts the erasing of a NAND string.

FIG. 7 depicts the movement of holes and electrons in a NAND string during a two-sided GIDL erase. An example NAND string 800 that includes a channel 891 connected to a bit line (BL) and to a source line (SL). A tunnel dielectric layer (TNL) 892, charge trapping layer (CTL) 893, and a blocking oxide layer (BOX) 898 are layers which extend around the memory hole of the NAND string (see discussion above). Different regions of the channel layers represent channel regions which are associated with respective storage elements or select gate transistors. These channel regions are at a same height and stack level in the stacked memory device as the control gates of the storage elements or select gate transistors.

An erase voltage Vera is applied to both the bit line (BL) and to the source line (SL). The NAND string 800 includes an SGD transistor 801 with a control gate 806 and a channel region 807. A voltage V_GIDL (e.g., Vera-5v) is applied to the control gate 806 of the SGD transistor 801. The NAND string 800 also includes storage elements 810, 815, 820, and 825, control gates 811, 816, 821, and 826, CTL regions 813, 818, 823, and 828, and channel regions 812, 817, 822, and 827, respectively.

The NAND string 800 includes an SGS transistor 802 with a control gate 856 and a channel region 857. The voltage V_GIDL is applied to the control gate 856 of the SGS transistor 802. The NAND string 800 also includes storage elements 860, 865, 870, and 875, control gates 861, 866, 871, and 876, CTL regions 863, 868, 873, and 878, and channel regions 862, 867, 872, and 877, respectively.

Representative holes are depicted in the channel layers as circles with a "+" sign and representative electrons are depicted in the channel layers as circles with a "−" sign. Electron-hole pairs are generated by a GIDL process. Initially, during an erase operation, the electron-hole pairs are generated at the SGD and SGS transistors. The holes move away from the driven ends into the channel, thereby charging the channel to a positive potential. The electrons generated at the SGD transistor 801 move toward the bit line (BL) due to the positive potential there. The electrons generated at the SGS transistor 802 move toward the source line (SL) due to the positive potential there. Subsequently, during the erase period of each storage element, additional holes are generated by GIDL at virtual junctions which are formed in the channel at the edges of the control gate of the storage element. However, some holes are also removed from the channel as they tunnel to the CTL regions.

Electrons are also generated by the GIDL process. Initially, during the erase operation, the electrons are generated at the SGD and SGS transistors and move toward the driven ends. Subsequently, during the erase period of each storage element, additional electrons are generated by GIDL at virtual junctions, which are formed in the channel at the edges of the control gate of the storage element.

At one end (e.g., drain side) of the NAND string, example electrons 840 and 841 move toward the bit line. Electron 840 is generated at the SGD transistor and electron 841 is generated at a junction of the storage element 815 in the channel region 817. Also, in the drain side, example holes including a hole 842 move away from the bit line as indicated by arrows. The hole 842 is generated at a junction of the storage element 815 in the channel region 817 and can tunnel into the CTL region 818 as indicated by arrow 843.

At the other end (e.g., source side) of the NAND string, example electrons 845 and 849 move toward the source line. Electron 845 is generated at the SGS transistor and electron 849 is generated at a junction of the storage element 865 in the channel region 867. Also, in the source side, example holes including a hole 847 move away from the source line as indicated by the arrow. The hole 847 is generated at a junction of the storage element 865 in the channel region 867 and can tunnel into the CTL region 868 as indicated by arrow 848.

Figure 8:
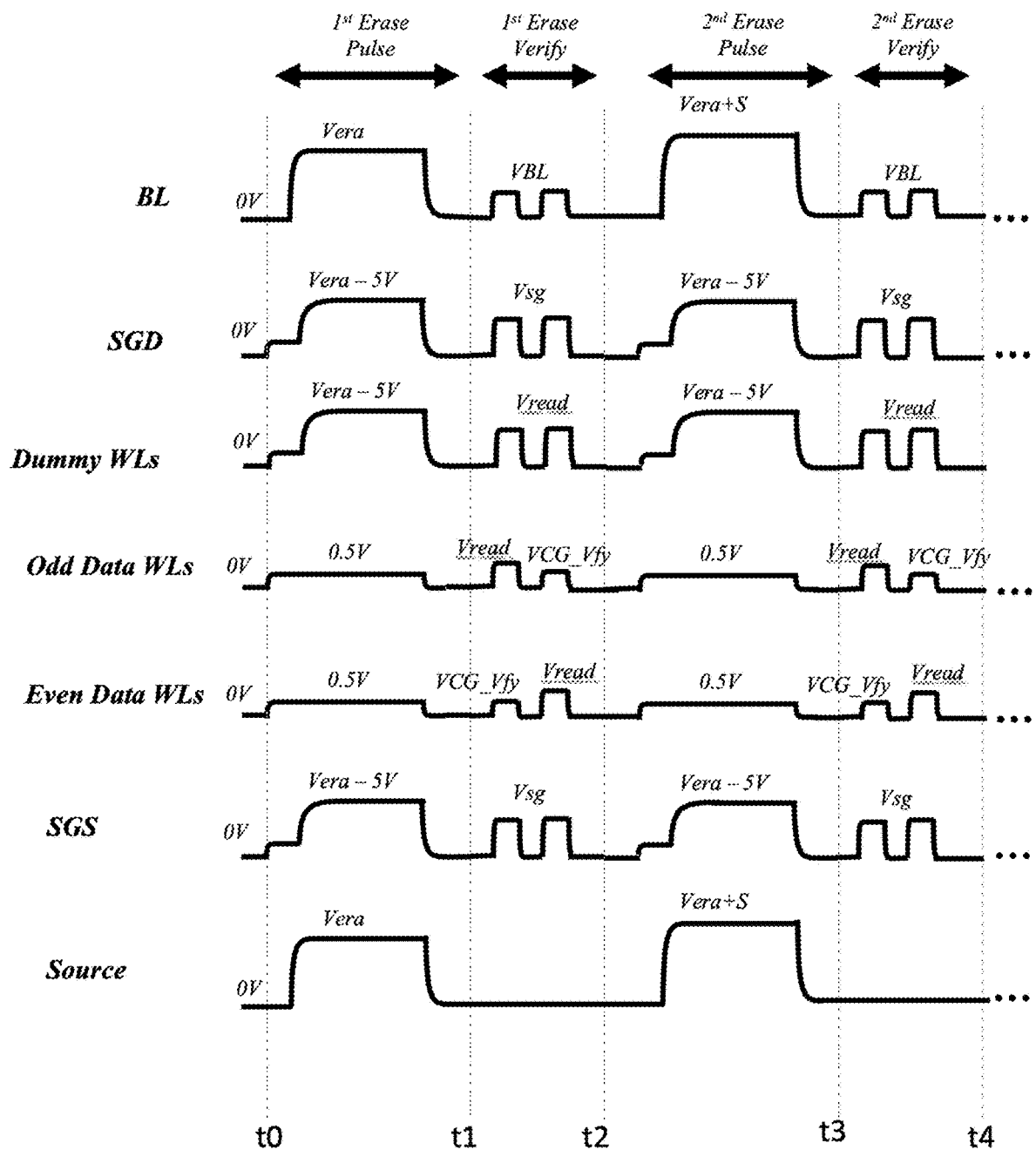
FIG. 8 is a signal diagram that depicts the signals applied to a NAND string during erase.
Figure 9:
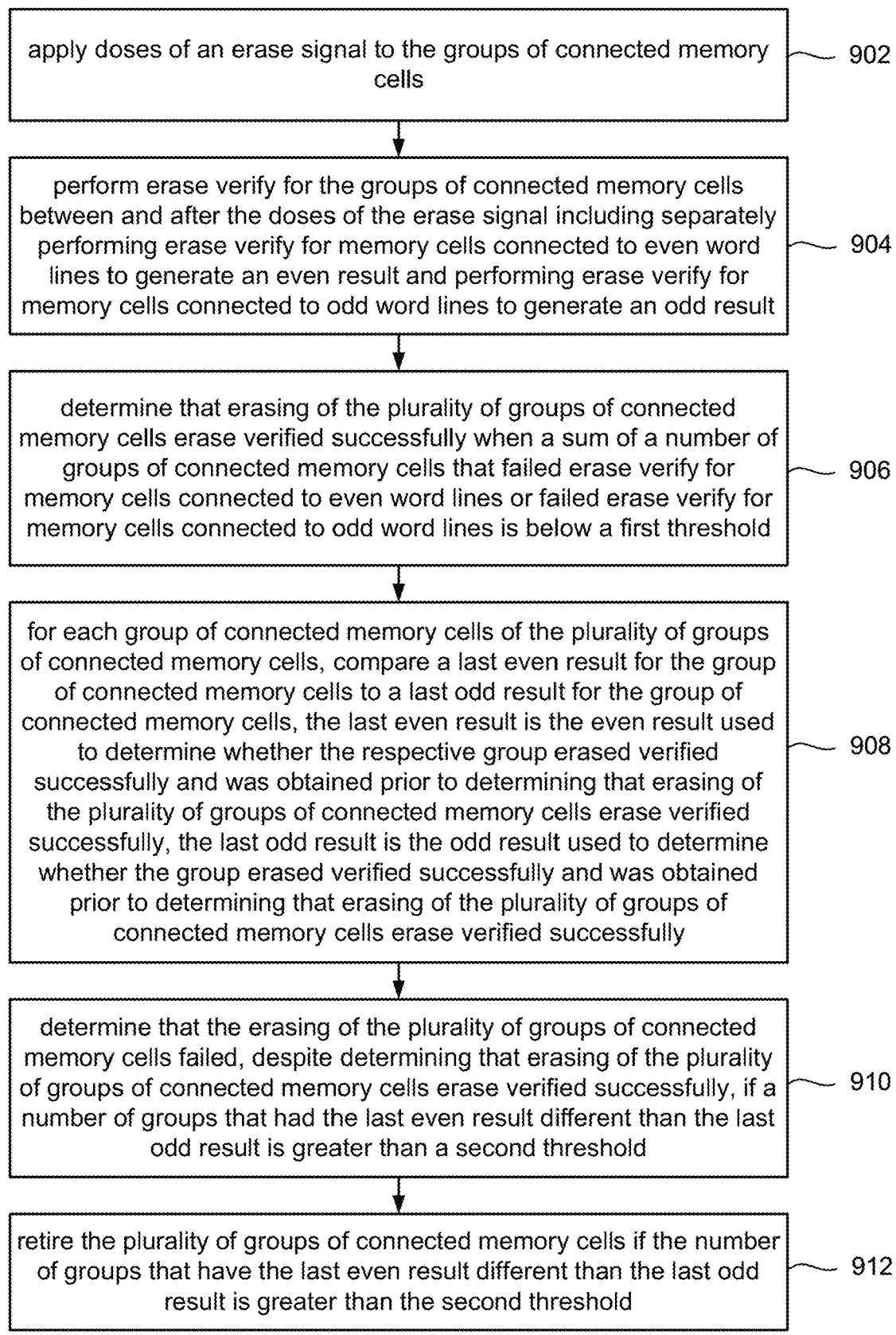
FIG. 9 is a flow chart describing one embodiment of a process for erasing non-volatile memory.

FIG. 8 is a timing diagram describing the signals applied to a block of non-volatile memory (see FIGS. 4-4G) during one embodiment of a two-sided GIDL erase operation. FIGS. 8 and 9 describe a means for erasing the vertical NAND strings by applying a plurality of erase voltage pulses to the plurality of NAND strings via the bit lines and/or source lines. FIG. 8 depicts behavior of the following signals: BL, SGD, Dummy WLs, Odd Data WLs, Even Data WLs, SGS and Source. The signal BL is the signal applied to all bit lines for the block being erased. The signal SGD is the signal applied to the gates of all the SGD transistors for all NAND strings of the block. The signal SGS is the signal applied to the gate of all the SGS transistors for all NAND strings of the block. The signal Source is the signal applied to the source line for the block. The signal Dummy WLs is the signal applied to the dummy word lines for the block, which connects to the control gates for all dummy memory cells. The signal Odd Data WLs is the signal applied to all odd data word lines (e.g., WL1, WL3, WL5, . . . ) for all NAND strings of the block. The signal Even Data WLs is the signal applied to all even data word lines (e.g., WL0, WL2, WL4, . . . ) for all NAND strings of the block. The data word lines are connected to the control gates of the data memory cells.

In general, the erase voltage is applied as a series of voltage pulses that increase in magnitude by a step size S (e.g., 0.1-0.3 volts). Between and after the erase voltage pulses, erase verify is performed which include testing to determine whether the NAND strings are successfully erased. For example, between t0 and t1 an erase voltage pulse is applied, between t2 and t3 another erase voltage pulse is applied, between t1 and t2 (between the erase voltage pulses) erase verify is performed, and so on. In one embodiment, all memory cells of all NAND strings are tested at the same time during erase verify. In another embodiment, as depicted in FIG. 8, memory cells connected to even word lines are tested separately from the testing of memory cells connected to odd word lines.

Between times t0 and t1 an erase voltage pulse is applied to BL and Source. The magnitude of the first erase voltage pulse is Vera (e.g., ~21 volts). Also between times t0 and t1, SGD and SGS are raised to a small initial voltage and then to Vera-5 volts to facilitate GIDL generation. In another embodiment, SGD and SGS are raised to an initial voltage and then to Vera-10 volts to facilitate GIDL generation. Also between times t0 and t1, Dummy WLs are set at Vera-5 volts, Odd Data WLs are set at 0.5 volts and Even Data WLs are set at 0.5 volts. The result of applying the erase voltage pulse is that the threshold voltages of the memory cells are lowered.

Between times t1 and t2, the systems perform erase verification. Source remains at ground during erase verify. A voltage VBL (e.g., ~0.6 volts) is applied to the bit lines BL. FIG. 8 shows two voltage pulses applied to BL between t1 and t2, as one voltage pulse is used to perform erase verify for memory cells connected to even word lines and the other voltage pulse is used to separately perform erase verify for memory cells connected to odd word lines. To facilitate the erase verify, two voltage pulses at Vsg (e.g., 0.3-0.6v) are applied to SGS and SGD and two voltage pulses at Vread (e.g., 8-10 volts) are applied to Dummy WLs. The Even Data WLs and the Odd Data WLs also receive two voltage pulses. First, the Even Data WLs receive a voltage pulse with a magnitude of VCG_Vfy (e.g., 0.5 volts), the Odd Data WLs receive a voltage pulse with a magnitude of Vread, and the Dummy WLs receive a voltage pulse with a magnitude of Vread. This causes the memory cells connected to odd word lines to strongly conduct current and the dummy memory cells to strongly conduct current, while testing whether the memory cells connected to the even word lines have a threshold voltage below ~0.5 volts (or another value demarcating the erased state). Second, the Odd Data WLs receive a voltage pulse with a magnitude of VCG_Vfy, the Even Data WLs receive a voltage pulse with a magnitude of Vread, and the Dummy WLs receive a voltage pulse with a magnitude of Vread. This causes the memory cells connected to even word lines to strongly conduct and the dummy memory cells to strongly conduct, while testing whether the memory cells connected to the odd word lines have a threshold voltage below ~0.5 volts (or another value demarcating the erased state).

During the time period between t2-t3 an additional erase voltage pulse is applied (with step size S indicating the increase in magnitude of the voltage pulse) in the same manner as described above with respect to the time period t0-t1. During the time period between t3-t4 an additional erase verify is performed in the same manner as described above with respect to the time period t1-t2. The process depicted in FIG. 8 continues with additional erase voltage pulses and additional erase verify until all or enough memory cells (or NAND strings) pass erase verify. More details are described below.

As mentioned above, defects in a non-volatile memory, such as a short or leak between a word line and a memory hole (e.g., a short or leak between a word line and the channel of a NAND string) can introduce an error into the data being stored. Sometimes such a defect does not appear until after the non-volatile memory has been in use. To prevent failures of the non-volatile memory when in use due to defects that are first seen during operation by a user, manufacturers of non-volatile memory may include various processes for testing the memory in an effort to detect defects before the non-volatile memory is used to store user data. One test for a leak between a word line and memory hole includes causing all memory cells of a set of NAND strings to be in a common threshold voltage distribution (e.g., in the erased state), performing sensing operations to test whether the memory cells are actually in the common threshold voltage distribution separately for memory cells connected to even word lines and memory cells connected to odd word lines, and determining whether the results of the sensing for even word lines matches the results of the sensing for odd word lines, respectively group by group. If the results of the sensing for even word lines does not match the results of the sensing for odd word lines, respectively group by group, then there may be a short or leak between a word line and a memory hole.

The above-described test for a leak between a word line and memory hole requires multiple sensing operations, which takes time and may impact system performance. Therefore, it is proposed to conduct the test during the erase process. Rather than perform the multiple additional sensing operations for the test, the results of the already performed erase verify process can be used so that no new sensing is required and no significant degrading in memory system performance is experienced.

For example, a non-volatile memory system performs erase verify for groups of connected memory cells (e.g., NAND strings) between and after doses of an erase signal including separately performing erase verify for memory cells connected to even word lines to generate an even result for each group and performing erase verify for memory cells connected to odd word lines to generate an odd result for each group. The even results and the odd results are used to determine if the erase verify process indicates that the erasing has successfully completed. In addition, for each group of connected memory cells, a last even result for the group of connected memory cells is compared to a last odd result for the group of connected memory cells. Even if the erase verify indicated that the erasing has successfully completed, the system may still determine that the erasing has failed due to a defect (e.g., a leak between a word line and memory hole) if the number of groups of connected memory cells that have the last even result different from its last odd result is greater than a limit. By using the results of the erase verify to identify defects, the memory system does not slow down the erase process (or otherwise materially degrade system performance) in order to perform extra sensing operations.

FIG. 9 is a flow chart describing one embodiment of a process for erasing non-volatile memory that includes testing for a defect (e.g., a leak between a word line and memory hole) without performing additional sensing operations that would slow down the erase process (or otherwise materially degrade system performance). That is, FIG. 9 describes one embodiment of a means for identifying existence of a defect by determining for multiple NAND strings whether even results from the erase verify process match odd results from the erase verify process for a same NAND string. In one example implementation, the process of FIG. 9 utilizes the two sided GIDL erase described by FIGS. 7 and 8. The process of FIG. 9 can be performed by any one of the one or more control circuits discussed above. For example, the process of FIG. 9 can be performed entirely by the memory die 200 (see FIG. 2A) or by the integrated memory assembly 207 (see FIG. 2B), rather than by memory controller 120. In one example, the process of FIG. 9 is performed by or at the direction of state machine 262, using other components of System Control Logic 260, Column Control Circuitry 210 and Row Control Circuitry 220. In another embodiment, the process of FIG. 9 is performed by or at the direction of memory controller 120.

In step 902, the control circuit applies doses of an erase signal. For example, erase voltage pulses can be applied to the bit lines and/or source line for a block of NAND strings, as depicted in FIG. 8. In step 904, the control circuit performs erase verify for the groups of connected memory cells between and after the doses of the erase signal including separately performing erase verify for memory cells connected to even word lines to generate an even result and performing erase verify for memory cells connected to odd word lines to generate an odd result. For example, the system can perform the erase verify process depicted in FIG. 8. In one embodiment, erase verify is performed for an entire block (or other grouping) of memory cells. In another embodiment, erase verify is performed separately for each sub-block (e.g., first perform erase verify for sub-block 0, second perform erase verify for sub-block 1, third perform erase verify for sub-block 2, . . . ). FIG. 8 shows two pulses applied to the bit lines and word lines during erase verify; however, if erase verify is performed separately for each sub-block then two pulses will be applied to the bit lines and word lines for each sub-block.

In step 906, the control circuit determines that erasing of the plurality of groups of connected memory cells erase verified successfully when a sum of a number of groups of connected memory cells that failed erase verify for memory cells connected to even word lines or failed erase verify for memory cells connected to odd word lines is below a first threshold. In some embodiments, the first threshold is greater than zero because the system may tolerate some errors in the erase process since the memory system's error correction capability can correct these errors.

Steps 908 and 910 include performing the test for defects (e.g., a leak between a word line and memory hole) without performing additional sensing operations that would slow down the erase process (or otherwise materially degrade system performance). For example, in one embodiment, steps 908 and 910 comprise identifying existence of a defect by determining for multiple groups of connected memory cells whether even results from the erase verify process match odd results from the erase verify process for a same group of connected memory cells. In step 908, for each group of connected memory cells of the plurality of groups of connected memory cells, the control circuit compares a last even result for the group of connected memory cells with a last odd result for the group of connected memory cells. The last even result is the even result used to determine whether the respective group erased verified successfully and was obtained prior to determining that erasing of the plurality of groups of connected memory cells erase verified successfully. The last odd result is the odd result used to determine whether the group erased verified successfully and was obtained prior to determining that erasing of the plurality of groups of connected memory cells erase verified successfully. In one example, the last even result is obtained after a last dose of the erase signal, and the last odd result is obtained after the last dose of the erase signal. In another example, the last even result and the last odd results are captured at the time that the group of connected memory cells (e.g., NAND string) successfully verifies (even if additional erase voltage pulses are applied for additional erasing of other groups/NAND strings).

In step 910, the control circuit determines that the erasing of the plurality of groups of connected memory cells failed, despite determining that erasing of the plurality of groups of connected memory cells erase verified successfully, if the number of groups of connected memory cells that have the last even result different than the last odd result is greater than a second threshold. The control circuit concludes that any group that has a last even result different from its last odd result has a defect (e.g., a leak between a word line and memory hole). If too many groups have the defect, then the erase process is deemed to have failed, and the block should be retired from further use. Thus, in step 912, the plurality of groups of connected memory cells are retired if the number of groups of connected memory cells that have the last even result different from its last odd result is greater than the second threshold.

In one set of embodiments, the first threshold is higher than the second threshold. For example, the first threshold may be 56 bits per 1000 bits and the second threshold may be 16 bits per 1000 bits. That is, the system may conclude that the erase process was successful, or at least that the erase verify process indicated that the erase process was successful, if no more than 5.6% of the NAND strings failed to erase verify. However, when performing the test for defects in steps 908 and 910, the system will conclude that a defect exists if there is a mismatch between even and odd results for 1.6% of NAND strings. Note that other values can be used for the first threshold and the second threshold.

Figure 10:
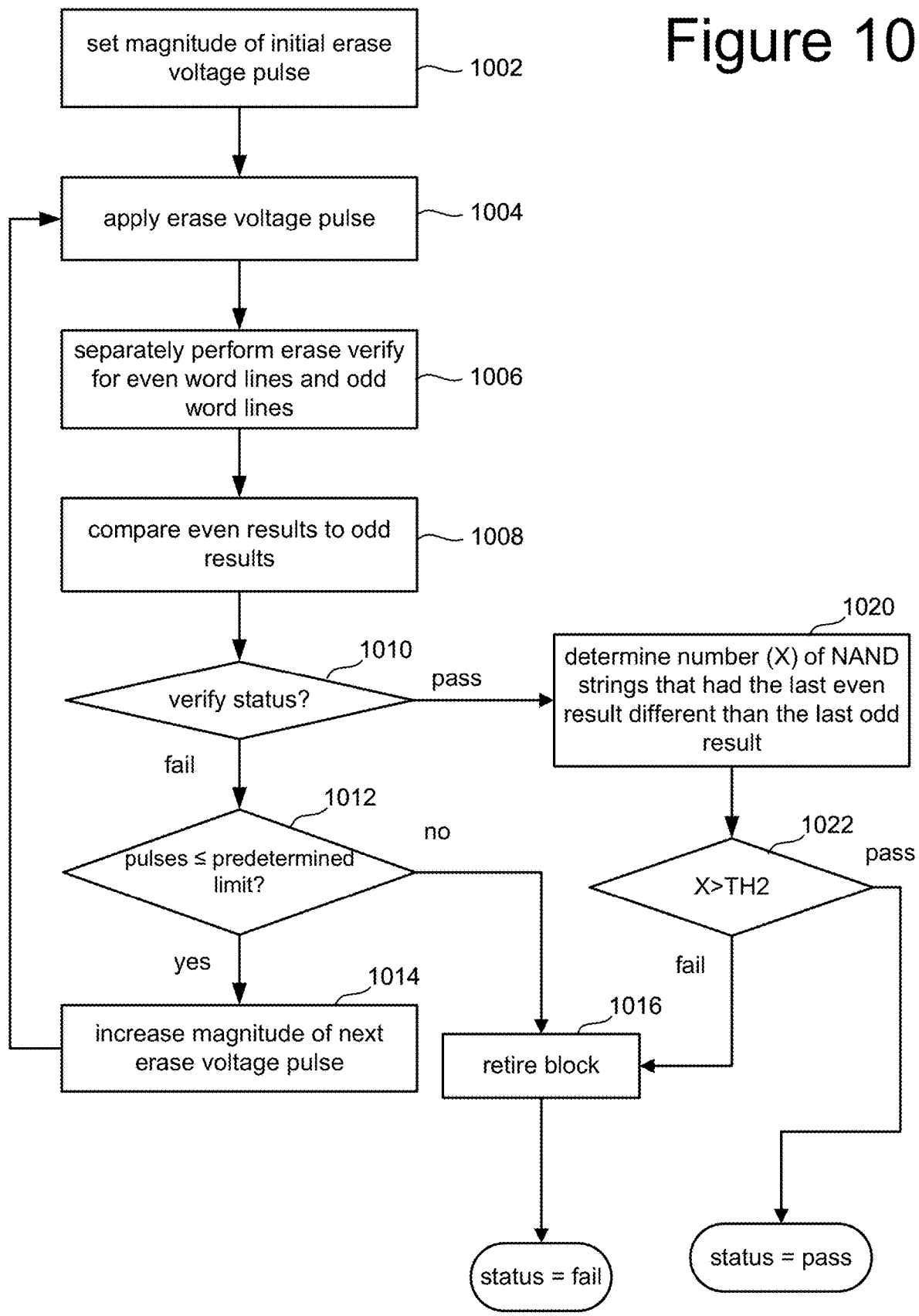
FIG. 10 is a flow chart describing one embodiment of a process for erasing non-volatile memory.

FIG. 10 is a flow chart describing one embodiment of a process for erasing non-volatile memory that includes testing for a defect (e.g., a leak between a word line and memory hole) without performing additional sensing operations that would slow down the erase process (or otherwise materially degrade system performance). That is, FIG. 10 describes one embodiment of a means for identifying existence of a defect by determining for multiple NAND strings whether an even result from the erase verify process matches an odd result from the erase verify process for each respective NAND string. In one example implementation, the process of FIG. 10 utilizes the two sided GIDL erase described by FIGS. 7 and 8. The process of FIG. 10 can be performed by any one of the one or more control circuits discussed above. For example, the process of FIG. 10 can be performed entirely by the memory die 200 (see FIG. 2A) or by the integrated memory assembly 207 (see FIG. 2B), rather than by memory controller 120. In one example, the process of FIG. 10 is performed by or at the direction of state machine 262, using other components of System Control Logic 260, Column Control Circuitry 210 and Row Control Circuitry 220. In another embodiment, the process of FIG. 9 is performed by or at the direction of memory controller 120. In one embodiment, the process of FIG. 10 is an example implementation of the process of FIG. 9.

In step 1002, the magnitude of the initial erase voltage pulse (Vera) is set. One example of an initial magnitude is 21 volts. However, other initial magnitudes can also be used. In step 1004, the erase voltage pulse is applied to the set of NAND strings. In one embodiment the erase voltage pulse is applied to the bit lines. In another embodiment the erase voltage is applied to the source line. In another embodiment the erase voltage pulse is applied to the bit lines and the source line. Step 1004 corresponds to the time period between t0 and t1 of FIG. 8. In step 1006, erase verify is performed separately for memory cells connected to even word lines and for memory cells connected to odd word lines. That is, the system will perform erase verify for those memory cells connected to even word lines while not performing erase verify for memory cells connected to odd word lines. Subsequently, the system will perform erase verify for those memory cells connected to odd word lines while not performing erase verify for memory cells connected to even word lines. Step 1006 corresponds to the timeframe between t1 and t2 of FIG. 8. When performing erase verify for memory cells connected to even word lines, the even word lines will receive VCG_Vfy and odd word lines will receive Vread. The system will sense the NAND strings (e.g., using the sense amplifiers) to determine if sufficient current is flowing. When performing erase verify for memory cells connected to odd word lines, the odd word lines will receive VCG_Vfy and even word lines will receive Vread. The system will again sense the NAND strings to determine if sufficient current is flowing.

When the NAND string has completed erasing, the erase verify for the memory cells connected to even word line should show a successful erase verify and the erase verify for memory cells connected to the odd word lines should show a successful erase verify. In step 1008, the results from the erase verify from memory cells connected to even word lines will be compared with the results from memory cells connected to odd word lines. Step 1008 is part of the testing for the defects, as discussed above. In step 1010, the system will determine the status of the erase verify (from step 1006). If all of the NAND strings passed erase verify for odd word lines and erase verify for even word lines, then the process will continue at step 1020. If the number of NAND strings that have failed either erase verify for even word lines or erase verify for odd word lines is less than the first threshold then the system will consider the verification process to have passed and the process will also continue in step 1020. If the number of NAND strings that have failed either erase verify for even word lines or erase verify for odd word lines is greater than the first threshold, then the process will continue with step 1012. The system will then determine whether the number of erase voltage pulses is greater than a predetermined limit. In one example, the predetermined limit is six pulses. In another example, the predetermined limit is 20 pulses. Other examples of predetermined limits can also be used. If the number of pulses is less than or equal to the predetermined limit and the system will perform another iteration of the erase process, which includes applying another erase pulse. Thus, the process will continue in step 1014 to increase the magnitude of the next erase voltage pulse and then the process will loop back to step 1004 to apply the next erase voltage pulse. If, in step 1012, it is determined that the number of erase voltage pulses already applied in the current erase process is greater than the predetermined limit, then the erase process failed and (at step 1016) the current block being erased is retired from any further use by the memory system.

If it is determined that the erase verify process indicated that the block of memory cells verified successfully because less than the first threshold number of NAND strings failed erase verify (step 1010), then in step 1020 the system will perform the testing for the defect. That is, the system will determine the number of NAND strings that had the last even result different from the last odd result. More details will be discussed below with respect to FIGS. 11 and 12. If the number of NAND strings that have a last even result different from its a last odd result is greater than the second threshold (TH2) in step 1022, then the test for the defects has failed, the block will be retired from any further use in step 1016, and the erase process has failed. If the number of NAND strings that have the last even result different from its last odd result is not greater than the second threshold (pass), then the system concludes that erase process was successful and the block is not defective.

Figure 11:
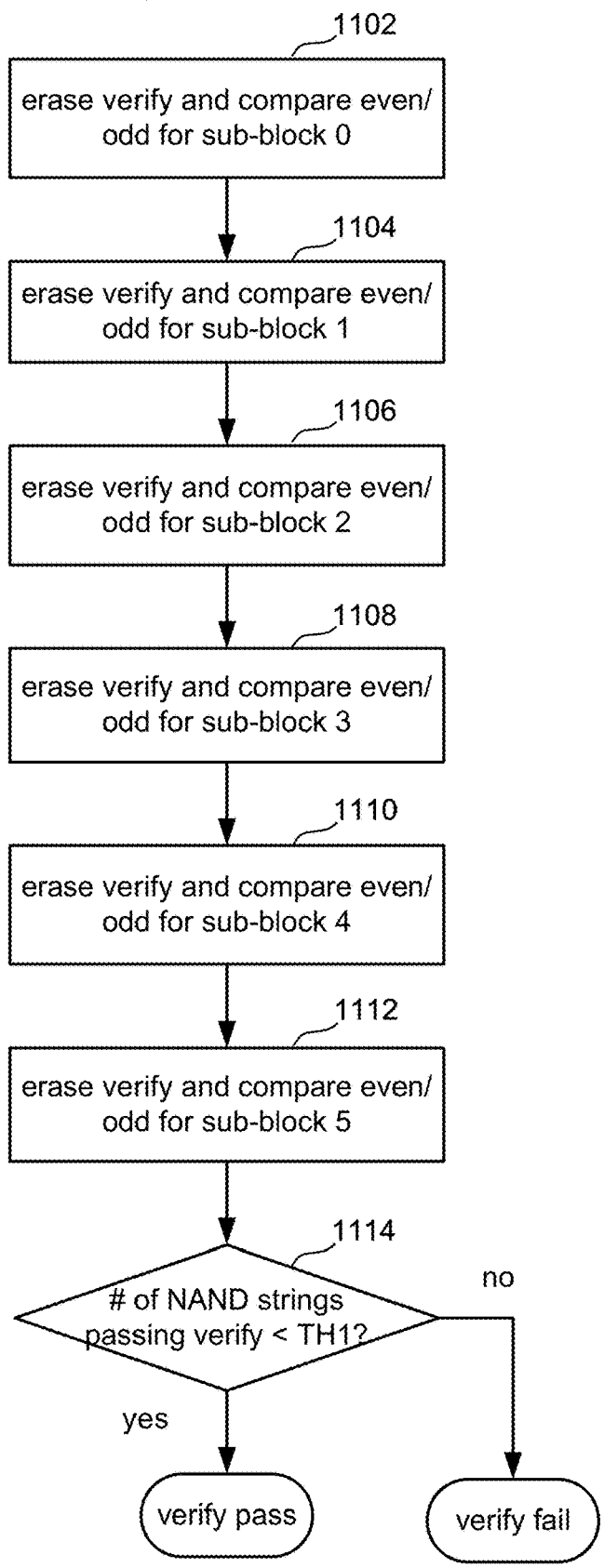
FIG. 11 is a flow chart describing one embodiment of a process for separately verifying erase and comparing odd/even results for multiple sub-blocks.

FIG. 11 is a flowchart describing one embodiment of a process for implementing steps 1006, 1008 and 1010 of FIG. 10. Additionally, the process of FIG. 11 provides an example of performing erase verify separately for each sub block. In step 1102 of FIG. 11, the control circuit performs erase verify for NAND strings in sub-block 0, and compares the even result from the erase verify for sub-block 0 to the odd result from the erase verify for sub-block 0. Note the process of FIG. 11 assumes six sub blocks. However, in other embodiments more or less the six sub-blocks can be implemented. In step 1104, the control circuit performs erase verify for NAND strings in sub-block 1, and compares the even result from the erase verify for sub-block 1 to the odd result from the erase verify for sub-block 1. In step 1106, the control circuit performs erase verify for NAND strings in sub-block 2, and compares the even result from the erase verify for sub-block 2 to the odd result from the erase verify for sub-block 2. In step 1108, the control circuit performs erase verify for NAND strings in sub-block 3, and compares the even result from the erase verify for sub-block 3 to the odd result from the erase verify for sub-block 3. In step 1110, the control circuit performs erase verify for NAND strings in sub-block 4, and compares the even result from the erase verify for sub-block 4 to the odd result from the erase verify for sub-block 4. In step 1112, the control circuit performs erase verify for NAND strings in sub-block 5, and compares the even result from the erase verify for sub-block 5 to the odd result from the erase verify for sub-block 5. In step 1114 of FIG. 11, the control circuit determines the number of NAND strings that passed erase verify. If the number of NAND strings that passed erase verify is less than the first threshold (TH1), then the erase verify process completed successfully and indicates that the erasing of the sub-block was successful. If the number of NAND strings that passed erase verify is not less than the first threshold (TH1), then the verify process failed (the erase verify process indicates that the erase process failed).

Figure 12:
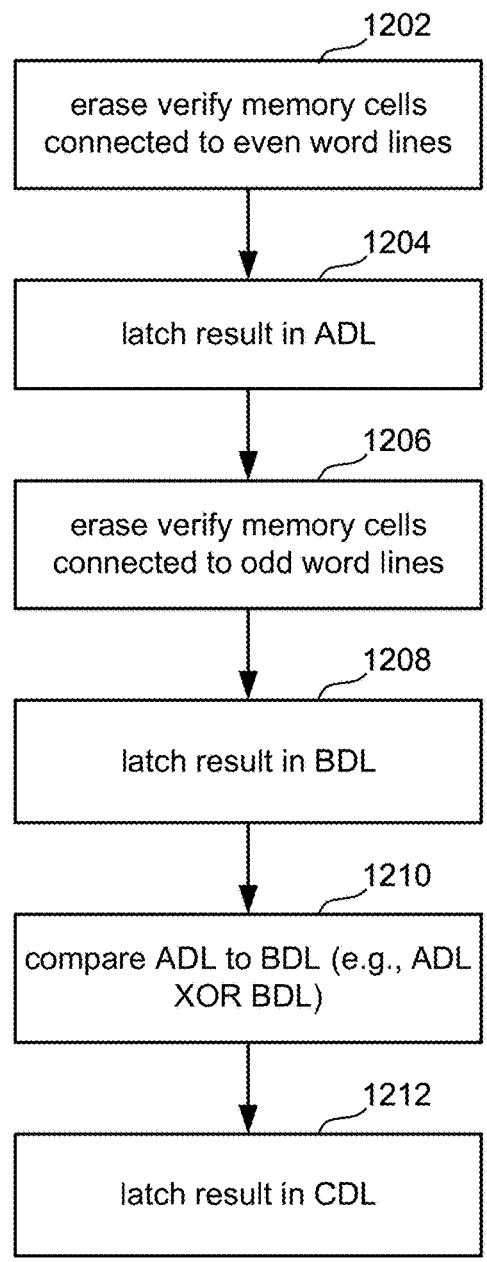
FIG. 12 is a flow chart describing one embodiment of a process for verifying erase and comparing odd/even results for a sub-block.

FIG. 12 is a flowchart describing one embodiment of a process for performing erase verify for NAND strings in a sub-block and comparing the even result from the erase verify for the sub-block to the odd result from the erase verify for the sub-block. Thus, the process of FIG. 12 is an example implementation of any of steps 1102-1112. Looking back at FIG. 3, the memory system includes a set of latches for each sense amplifier including ADL, BDL, CDL and XDL. In other embodiments, more or less the four latches can be implemented. The process of FIG. 12 uses three of those latches: ADL, BDL and CDL. In step 1202 of FIG. 12, erase verify is performed for memory cells connected even word lines of the current sub-block being operated on. For example, the even word lines (e.g., all even word liens of the block) will receive VCG_Vfy and the attached sense amplifiers will determine whether current flows in the NAND strings of the sub-block. If so, then the memory cells connected to even word lines have successfully verified. In step 1204, the result of the erase verify of step 1202 is stored in the latch ADL. For example, if the NAND strings conducted sufficient current during the erase verify such that the memory cells connected to even word lines passed erase verify, then a logic one is stored or latched in ADL. If the NAND strings did not conduct sufficient current during the erase verify, then a logic zero is stored or latched in ADL.

In step 1206 of FIG. 12, erase verify is performed for memory cells connected to odd word lines for the sub-block being operated on. For example, the odd word lines (e.g., all odd word liens of the block) will receive VCG_Vfy and the attached sense amplifiers will determine whether current flows in the NAND strings of the sub-block. If so, then the memory cells connected to odd word lines have successfully verified. In step 1208, the result of the erase verify of step 1206 is stored in the latch BDL. For example, if the NAND strings conducted sufficient current during the erase verify such that the memory cells connected to odd word lines passed erase verify, then a logic one is stored or latched in BDL. If the NAND strings did not conduct sufficient current during the erase verify, then a logic zero is stored or latched in BDL.

In step 1210, the data stored in ADL is compared to the data stored to BDL. In one embodiment processor 330 (see FIG. 3) will perform an exclusive OR (XOR) of ADL and BDL (e.g., ADL XOR BDL). In step 1212, the result of the comparison of step 1210 is stored (latched) in CDL. In one embodiment, step 1212 includes storing logic 0 in CDL if ADL matches BDL and storing logic 1 in CDL if ADL does not match BDL. When the system determines in step 1020 of FIG. 10 whether the number of NAND strings that have different results is greater than the second threshold, the control circuit can count the number of logic ones in the various CDL latches.

FIGS. 10-12 show that in one embodiment the control circuit is configured to store an even result in ADL, store an odd result in BDL, compare the even result to the odd result, and store the result of the comparison in CDL after each erase voltage pulse. However, it is the last even result taken and the last odd result taken that is used to make the final determination whether there is a defect. Note that the last even result is stored in ADL and the last odd result is stored in BDL before (e.g., immediately before) the system determines whether it passed erase verify. Therefore, at the time that the control circuit determines that the number of strings passing erase verify is less than the first threshold (step 1114), the last even result is currently residing in ADL and the last odd result is currently residing in BDL. However, other variations can also be implemented in terms of the timing. In other embodiments, the even and odd results may only be stored and/or only compared after the last erase voltage pulse.

A system has been described that includes testing for a defect (e.g., a leak between a word line and memory hole) while erasing non-volatile memory without performing additional sensing operations that would slow down the erase process (or otherwise materially degrade system performance). This testing can be performed prior to programming data to blocks that have already experienced a failed read process or in response to a failed read process in order to detect a bad block before there is a data loss. In this manner, system performance can be improved. For example, defects often are discovered when a read process fails. To prevent loss of data, some memory system have various mechanisms for recovering data that cannot be read using a standard read process that has failed due to a physical defect. While these recovery mechanisms are often successful at preventing data loss, they are slow and have a significant impact on system performance. Some memory systems allow blocks to have one read failure and, will retire a block only after two read failures. Each failure is referred to as a strike; therefore, blocks with one strike are allowed to store host data and blocks with two strikes are retired and no longer eligible to store host data. A block that has been retired because it has two strikes, has undergone two data recovery processes, each one taking a long time and slowing system performance. Therefore, to increase system performance, it is proposed to utilize the above testing for a defect after a block has received its first strike and prior to receiving a second strike. For example, after receiving a first strike and prior to programming new data, the erase process performed just prior to the programing of new data can include the above-described test for a defect. Additionally, a block that fails a read process can be immediately tested for a defect, as described above, rather than wait for a second read process to fail.

Figure 13:
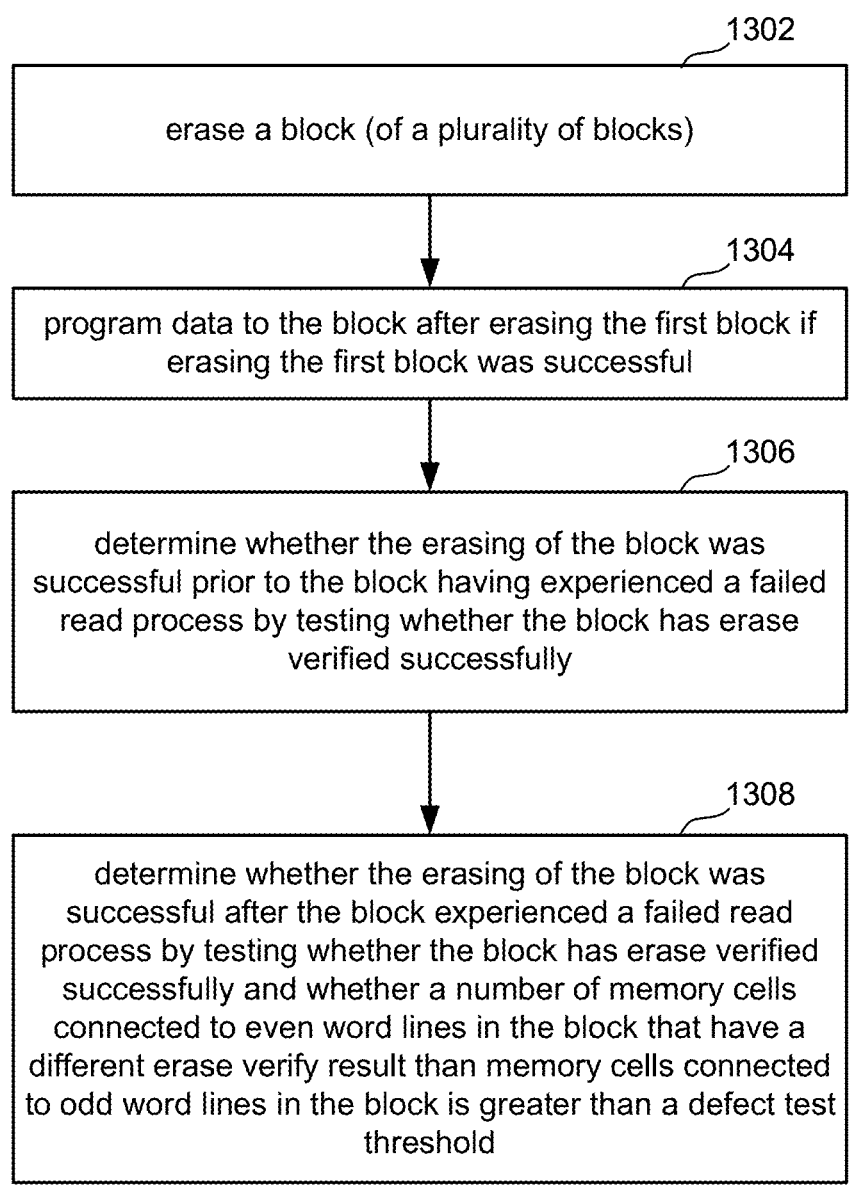
FIG. 13 is a flow chart describing one embodiment of a process for programming that includes testing for defects prior to programming for blocks of data that have already experienced a failed read process.

FIG. 13 is a flow chart describing one embodiment of a process for programming that includes testing for defects prior to programming for blocks of data that have already experienced a failed read process. The process of FIG. 13 can be performed by any one of the control circuits discussed above. For example, the process of FIG. 13 can be performed entirely by the memory die 200 (see FIG. 2A) or by the integrated memory assembly 207 (see FIG. 2B), rather than by memory controller 120. In one example, the process of FIG. 13 is performed by or at the direction of state machine 262, using other components of System Control Logic 260, Column Control Circuitry 210 and Row Control Circuitry 220. In another embodiment, the process of FIG. 13 is performed by or at the direction of memory controller 120. In another embodiment, the process of FIG. 13 is performed by a combination of memory controller 120 in cooperation with the System Control Logic 260, Column Control Circuitry 210 and Row Control Circuitry 220.

In step 1302 of FIG. 13, the control circuit erases a block (of a plurality of blocks). FIGS. 7-10 provide examples of erasing. In step 1304, the control circuit programs data to the block after erasing the block if erasing the block was successful. FIG. 6 provides an example of programming for the embodiments of FIGS. 5A-5D. In step 1306, the control circuit determines whether the erasing of the block was successful prior to the block having experienced a failed read process by testing whether the block has erase verified successfully. FIG. 12 provides an example of erase verification. In step 1308, the control circuit determines whether the erasing of the block was successful for blocks that have experienced a failed read process by testing whether the block has erase verified successfully and additionally testing whether a number of groups having memory cells connected to even word lines in the block that have a different erase verify result than memory cells connected to odd word lines in the block is greater than a defect test threshold. FIGS. 9 and 10 provide flow charts of example embodiments for erasing that includes testing whether the block has erase verified successfully (e.g., steps 904/906 and 1006) and whether a number of NAND strings having memory cells connected to even word lines in the block that have a different erase verify result than memory cells connected to odd word lines in the block is greater than a defect test threshold (e.g., steps 908/910 and steps 1008/1020/1022).

Figure 14:
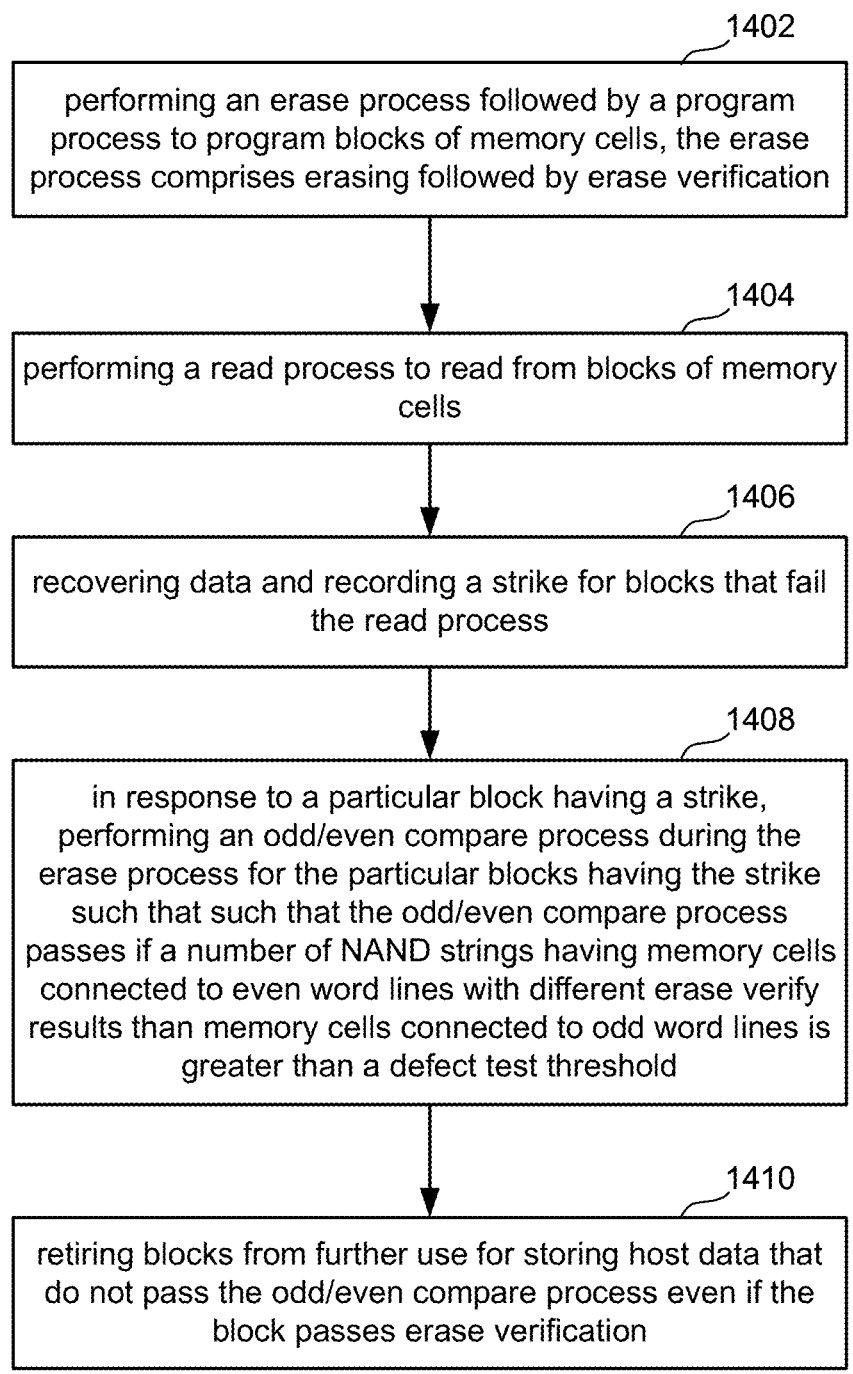
FIG. 14 is a flow chart describing one embodiment of a process for programming that includes testing for defects prior to programming for blocks of data that have already experienced a failed read process.

FIG. 14 is a flow chart describing another embodiment of a process for programming that includes testing for defects prior to programming for blocks of data that have already experienced a failed read process. The process of FIG. 14 can be performed by any one of the control circuits discussed above. For example, the process of FIG. 14 can be performed entirely by the memory die 200 (see FIG. 2A) or by the integrated memory assembly 207 (see FIG. 2B), rather than by memory controller 120. In one example, the process of FIG. 14 is performed by or at the direction of state machine 262, using other components of System Control Logic 260, Column Control Circuitry 210 and Row Control Circuitry 220. In another embodiment, the process of FIG. 14 is performed by or at the direction of memory controller 120. In another embodiment, the process of FIG. 14 is performed by a combination of memory controller 120 in cooperation with the System Control Logic 260, Column Control Circuitry 210 and Row Control Circuitry 220.

In step 1402, the control circuit performs an erase process followed by a program process to program blocks of memory cells. The erase process comprises erasing followed by erase verification. FIGS. 7 and 8 describe erasing. FIGS. 9 and 10 provide flow charts of example embodiments for erasing and erase verification. FIG. 6 provides an example of programming for the embodiments of FIGS. 5A-5D. In step 1404, the control circuit performs a read process to read from blocks of memory cells. In step 1406, the control circuit recovers data and records a strike for blocks that fail the read process. In step 1408, in response to a particular block having a strike, the control circuit performs an odd/even compare process during the erase process for the particular blocks having the strike such that the odd/even compare process passes if a number of NAND strings having memory cells connected to even word lines with different erase verify results than memory cells connected to odd word lines is greater than a defect test threshold. Examples of the odd/even compare process include steps 908/910 and steps 1008/1020/1022. In step 1410, the control circuit retires blocks from further use for storing host data that do not pass the odd/even compare process even if the block passes erase verification.

Figure 15:
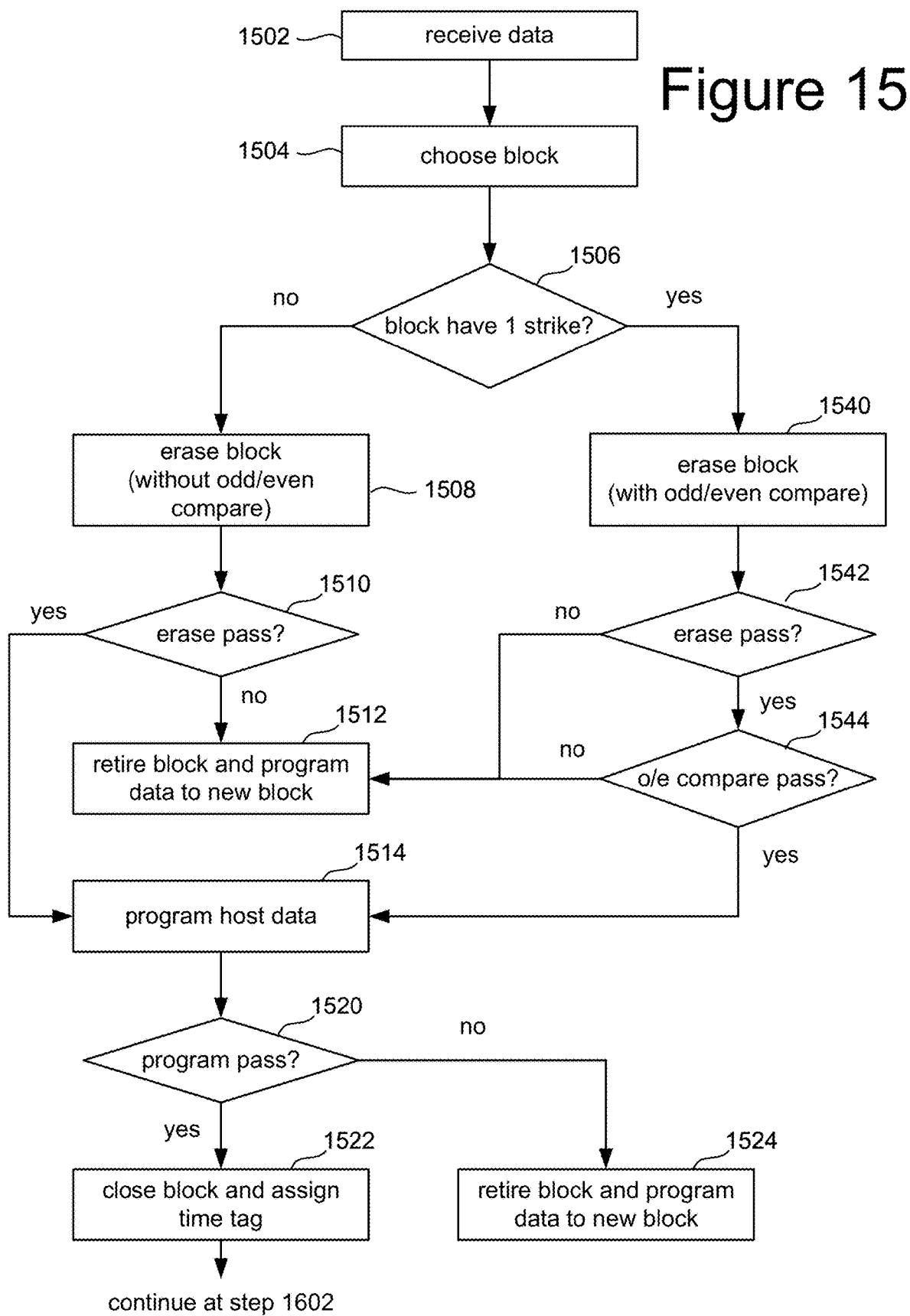
FIGS. 15 and 16 together form a flow chart describing one embodiment of a process for programming that includes testing for defects prior to programming for blocks of data that have already experienced a failed read process.
Figure 16:
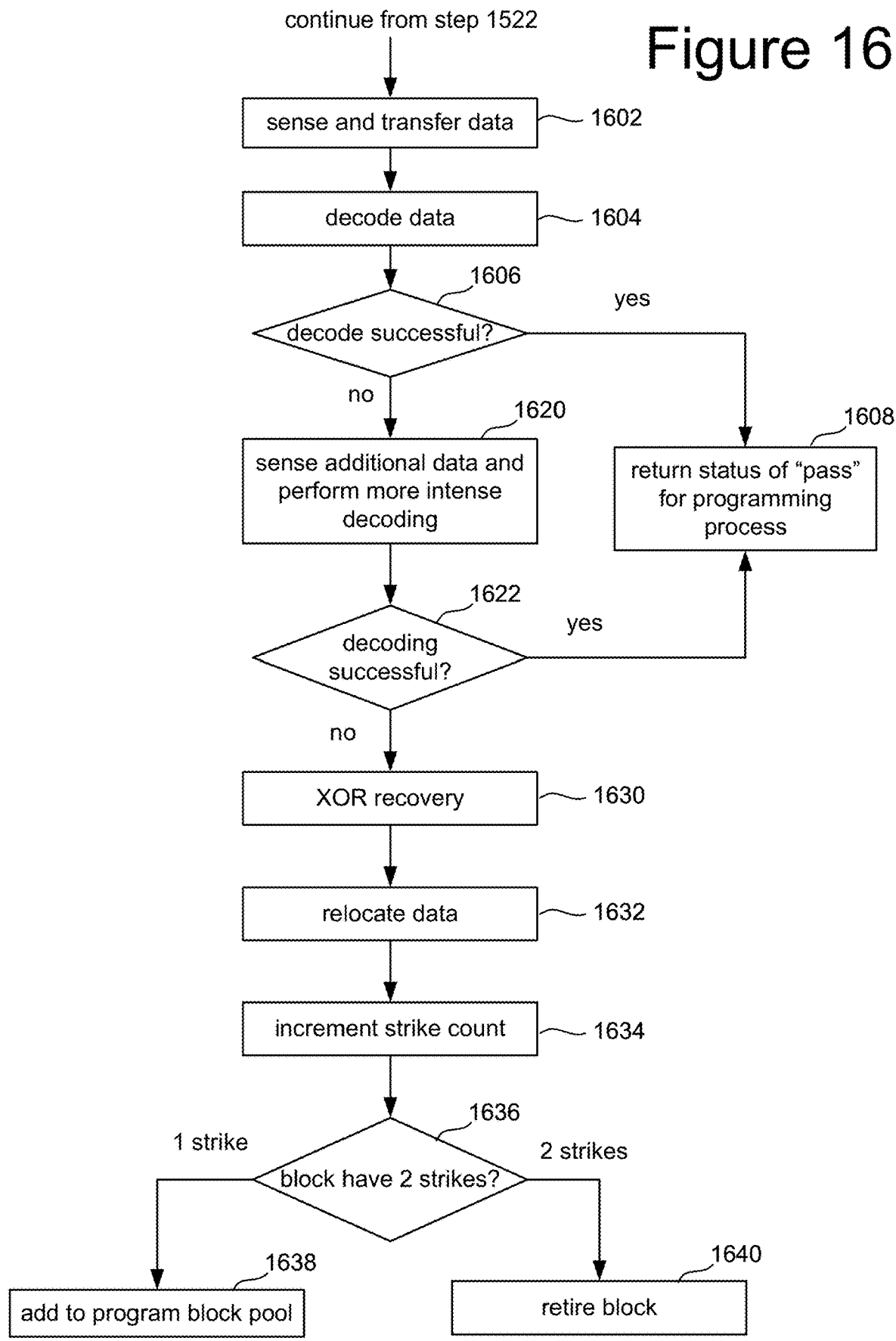

FIGS. 15 and 16 together form a flow chart describing an embodiment of a process for programming that includes testing for defects prior to programming for blocks of data that have already experienced a failed read process. The process of FIGS. 15 and 16 can be performed by any one of the control circuits discussed above. For example, the process of FIGS. 15 and 16 can be performed entirely by the memory die 200 (see FIG. 2A) or by the integrated memory assembly 207 (see FIG. 2B), rather than by memory controller 120. In one example, the process of FIGS. 15 and 16 is performed by or at the direction of state machine 262, using other components of System Control Logic 260, Column Control Circuitry 210 and Row Control Circuitry 220. In another embodiment, the process of FIGS. 15 and 16 is performed by or at the direction of memory controller 120. In another embodiment, the process of FIGS. 15 and 16 is performed by a combination of memory controller 120 in cooperation with the System Control Logic 260, Column Control Circuitry 210 and Row Control Circuitry 220. In one embodiment, the process of FIGS. 15 and 16 is an example implementation of the process of FIG. 13 and/or an example implementation of the process of FIG. 14.

In step 1502, memory controller 120 (or the control die or the memory die) receive data from host 102. That data is to be programmed into the non-volatile memory array 202. The data can include one or more pages of data (including enough data to fill one or more blocks). In step 1504, memory controller 120 chooses a block (or multiple blocks) to store the data. In one embodiment, memory controller maintains a program block pool, which is a list of blocks that are available to be used to store host data (i.e. data received from host 102). In one embodiment, blocks in the program block pool are not storing any valid data. Thus, in one embodiment, step 1504 includes the memory controller choosing a block in the program block pool. As discussed above, in some memory system, when a block experiences a first failed read process a strike is recorded against that block. A block with one strike may still be used to store host data. If a block experiences a second failed read process a second strike is recorded against that block. A block with two strikes may not be used to store host data. As such, if a block has two strikes then it will not be included in the program block pool. All of the blocks in the program block pool either have no strikes or one strike. Once a block gets a second strike, it is retired from further use for storing host data. In step 1506, memory controller 120 (or other control circuit) determines whether the block chosen in step 1504 has one strike or zero strikes.

If the block chosen in step 1504 has zero strikes, then it is subjected to a standard erase process (e.g., see FIGS. 7 and 8) that does not include the above-described odd/even compare process (see e.g., steps 908/910 or steps 1008/1020/1022). That is, in one embodiment, the block is erased without testing for defects (or, at least, without the above-described test for defects). If the erase process does not pass (e.g., the erase process failed due to erase verify failing), then in step 1512 the block is retired from further use for storing host data. If the erase process passes (e.g., erase verify was successful and all or enough memory cells are in the erased data state), then in step 1514 the host data received in step 1502 is programmed into the block (e.g., using the process of FIG. 6).

If the block chosen in step 1504 has one strike, then the block is erased in step 1540 using an erase process that includes the above-described odd/even compare process. For example, the erasing of step 1540 includes performing the process of FIG. 10. If (in step 1542) the erase process does not pass (e.g., the erase process failed due to erase verify failing), then in step 1512 the block is retired from further use for storing host data. If the erase process passes (e.g., erase verify was successful and all or enough memory cells are in the erased data state), then in step 1544 it is determined whether the odd/even compare process passed (see e.g., step 1022 of FIG. 10). That is, the system determines whether the number of NAND strings that have a last even result not matching the last odd result is greater than a defect test threshold. If the odd/even compare process did not pass (e.g., the number of NAND strings that have a last even result not matching the last odd result is greater than the defect test threshold), then in step 1512 the block is retired from further use for storing host data. If the odd/even compare process did passes (e.g., the number of NAND strings that have a last even result not matching the last odd result is less than the defect test threshold), then in step 1514 the host data received in step 1502 is programmed into the block (e.g., using the process of FIG. 6).

In step 1520, it is determined whether the program process of step 1514 passed. That is, did the programming process complete successfully (e.g., step 614 of FIG. 6). If the programming process did not complete successfully, then in step 1524 the block is retired from further use for storing host data and the data that was supposed to be programmed in step 1514 is re-programmed to a different block (e.g., using the process of FIG. 15). Additionally, other data already programmed in the current block can also be re-programmed to the different block. If the programming process did complete successfully, then in step 1522 the block is closed (if all word lines have been programmed) and a time tag (e.g., time of programming and temperature at the time of programming) is assigned and stored for the block by the memory controller 120. After step 1522, the process continues at step 1602 of FIG. 16.

In one embodiment, immediately after completing the programming the data is read back to confirm integrity of the data and the block. Thus, in step 1602 the data is sensed on the memory die and transferred to the memory controller 120. In step 1604, the memory controller decodes the data (or attempts to decode the data). When data is programmed, it is encoded with error correction information to form code words. Therefore, when data is read, it has to be decoded back to the original data. If the decoding was successful (step 1606), then in step 1608 a status of "pass" is returned to the host to indicate that the programming was completed successfully. If the decoding was not successful (step 1606), then in step 1620 additional sensing is performed. As mentioned above, the memory system reads data by sensing at the read reference voltages (e.g., voltages, VrA, VrB, VrC, VrD, VrE, VrF, and VrG of FIG. 5C). In step 1620, the memory die will sense at additional voltages above and below each of the read reference voltages to obtain additional data that is used to perform a more intense decoding. If the more intense decoding is able to successfully decode the data (step 1622), then in step 1608 a status of "pass" is returned to the host to indicate that the programming was completed successfully.

If the more intense decoding is not able to successfully decode the data (step 1622), then then the read process has failed (i.e. the block has experienced a failed read process) and in step 1630 an XOR recovery process is performed. In one embodiment, when data is programmed into memory cells connected to a word line of a block, that data is XOR'd with the other data of the same block. The memory controller maintains an XOR sum for each block that represents all data for that block XOR'd together. If a subset of data is lost, it can then be recovered by reading all of the other data of the block and using the XOR sum to recover the lost data. Thus, step 1630 comprises reading all of the other data of the block and using the XOR sum to recover the lost data (the data that was not decoded successfully). In other embodiments, the data may also be recovered from a temporary location in the memory controller as it was just programmed. After recovering the data in step 1630, the recovered data is relocated by re-programming it to a different block. In one embodiment, other data from the block is also relocated to the same different block (or another different block).

In step 1634, the system records a strike for the block since the block experienced a failed read process. Thus, the strike count for that block is incremented. If the block previously had zero strikes, now it has one strike. If the block previously had one strike, now it has two strikes. In step 1636, it is determined whether the block has one strike or two strikes? If the block has one strike, then it can still be used to store host data; therefore, the block is added back to the program bock pool in step 1638. If the block has two strikes, then the block is retired from further use in step 1640 and no longer eligible to store host data.

FIG. 16 describes a process of reading data immediately after programming. In another embodiment, the data can be read at a later time after programming. The above discussion of FIGS. 15 and 16 were written, for example purposes, for the embodiment that includes the process being performed by the memory controller; however, in other embodiments other control circuits can be used to perform the process (as discussed above).

FIG. 17 is a flow chart describing one embodiment of a process for reading data that includes testing for defects in response to a failed read process. The process of FIG. 17 can be performed immediately after programming or at a later time (i.e., any time) after programming. The process of FIG. 17 can be performed by any one of the control circuits discussed above. For example, the process of FIG. 17 can be performed entirely by the memory die 200 (see FIG. 2A) or by the integrated memory assembly 207 (see FIG. 2B), rather than by memory controller 120. In one example, the process of FIG. 17 is performed by or at the direction of state machine 262, using other components of System Control Logic 260, Column Control Circuitry 210 and Row Control Circuitry 220. In another embodiment, the process of FIG. 17 is performed by or at the direction of memory controller 120. In another embodiment, the process of FIG. 17 is performed by a combination of memory controller 120 in cooperation with the System Control Logic 260, Column Control Circuitry 210 and Row Control Circuitry 220.

In step 1702 of FIG. 17, host 102 sends a request to storage system 100 (e.g., received at host interface 152 of memory controller 120) to read data. In response to the request, memory controller 120 issues one or more read commands to one or more memory die 200 (or one or more control die 211). After receiving the one or more read commands the memory die senses the data and transfers the sensed data to the memory controller. The transferred data is decoded (or attempted to be decoded) by memory controller 120 (or control die 211) in step 1708. If the decoding was successful (step 1710), then the decoded data is returned to the host 102 in step 1712. If the decoding of step 1708 was not successful (step 1710), then in step 1714 the memory die senses additional data and the memory controller performs more intense decoding, as discussed above with respect to FIG. 16. If the more intense decoding is able to successfully decode the data (step 1716), then the decoded data is returned to the host 102 in step 1712. If the more intense decoding is not able to successfully decode the data (step 1716), then then the read process has failed (i.e. the block has experienced a failed read process) and in step 1718 an XOR recovery process is performed (see discussion of step 1630 of FIG. 16).

If the data is successfully recovered by the XOR process (step 1720), then the recovered data is returned to the host 102 in step 1730. In step 1732, the recovered data is relocated by re-programming it to a different block. In one embodiment, other data from the block is also relocated to the same different block (or another different block). In step 1734, the system records a strike for the block since the block experienced a failed read process. Thus, the strike count for that block is incremented. If the block previously had zero strikes, now it has one strike. If the block previously had one strike, now it has two strikes. In step 1736, it is determined whether the block has less than two strikes (e.g., one strike or zero strikes). If the block does not have less than two strikes, then the block is retired from further use in step 1760 and is no longer eligible to store host data.

If the block does have less than two strikes (step 1736), then the block is erased in step 1738 using an erase process that includes the above-described odd/even compare process. For example, the erasing of step 1738 includes performing the process of FIG. 10. If (in step 1740) the erase process does not pass (e.g., the erase process failed due to erase verify failing), then in step 1760 the block is retired from further use for storing host data. If the erase process passes (e.g., erase verify was successful and all or enough memory cells are in the erased data state), then in step 1742 it is determined whether the odd/even compare process passed (see e.g., step 1022 of FIG. 10). For example, the system determines whether the number of NAND strings that have a last even result not matching the last odd result is greater than the defect test threshold. If the odd/even compare process did not pass (e.g., the number of NAND strings that have a last even result not matching the last odd result is greater than the defect test threshold), then in step 1760 the block is retired from further use for storing host data. If the odd/even compare process did passes (e.g., the number of NAND strings that have a last even result not matching the last odd result is less than the defect test threshold), then in step 1750 the block is added back to the program block pool so it can be used again. The above discussion of FIG. 17 was written, for example purposes, for the embodiment that includes the process being performed by the memory controller; however, in other embodiments other control circuits can be used to perform the process (as discussed above).

A system has been described that includes testing for a defect (e.g., a leak between a word line and memory hole) while erasing non-volatile memory without performing additional sensing operations that would slow down the erase process (or otherwise materially degrade system performance). This testing can be efficiently performed prior to programming data to blocks that have already experienced a failed read process or in response to a failed read process in order to identify a defect prior to another read failure that would require a lengthy data recovery process.

One embodiment includes a non-volatile storage apparatus, comprising: a non-volatile memory structure comprising a plurality of blocks of memory cells and a plurality of word lines, the plurality of word lines including even word lines and odd word lines; and a control circuit connected to the non-volatile memory structure. The memory cells are arranged in groups. The control circuit is configured to program data to a first block of the plurality of blocks after erasing the first block if erasing the first block was successful. The control circuit is configured to determine whether the erasing the first block was successful prior to the first block having experienced a failed read process by testing whether the first block has erase verified successfully. The control circuit is configured to determine whether the erasing the first block was successful after the first block experienced a failed read process by testing whether the first block has erase verified successfully and additionally testing whether a number of groups having memory cells connected to even word lines in the first block that have a different erase verify result than memory cells connected to odd word lines in the first block is greater than a defect test threshold.

In one example implementation, the first block includes memory cells arranged in vertical NAND strings; and the control circuit is configured to determine whether the erasing the first block was successful after the first block experienced a failed read process by: applying doses of an erase signal to the NAND strings, performing erase verify for the NAND strings between and after the doses of the erase signal including separately performing erase verify for memory cells connected to even word lines to generate an even result and performing erase verify for memory cells connected to odd word lines to generate an odd result, determining that erasing of the NAND strings erase verified successfully when a sum of a number of NAND strings that failed erase verify for memory cells connected to even word lines or failed erase verify for memory cells connected to odd word lines is below a first threshold, for each NAND string, comparing a last even result for the NAND strings to a last odd result for the NAND string, the last even result is the even result used to determine whether the respective NAND string erased verified successfully and was obtained prior to determining that the NAND strings erase verified successfully, the last odd result is the odd result used to determine whether the respective NAND string erase verified successfully and was obtained prior to determining that the NAND strings erase verified successfully, and determining whether the erasing of the NAND strings failed, despite determining that erasing of the NAND strings erase verified successfully, by determining whether a number of NAND strings that have the last even result different than the last odd result is greater than the defect test threshold. Additionally, the control circuit is configured to determine whether the erasing the first block was successful prior to the first block having experienced a failed read process without determining whether the erasing of the NAND strings failed by determining whether the number of NAND strings that have the last even result different than the last odd result is greater than the defect test threshold. In one example, the first threshold is higher than the defect test threshold; the last even result is obtained after a last dose of the erase signal; and the last odd result is obtained after the last dose of the erase signal.

In one example implementation, the control circuit includes a first latch and a second latch; the control circuit is configured to store the even result in the first latch and store the odd result in the second latch after each dose of the erase signal; the last even result is in the first latch when determining that erasing of the plurality of groups of connected memory cells erase verified successfully; the last odd result is in the second latch when determining that erasing of the plurality of groups of connected memory cells erase verified successfully; and the control circuit is configured to compare the last even result for the NAND strings to the last odd result for the NAND string by comparing contents of the first latch to contents of the second latch.

One embodiment includes a method of operating non-volatile storage, comprising: performing an erase process followed by a program process to program blocks of memory cells arranges as NAND strings, the erase process comprises erasing followed by erase verification; performing a read process to read from blocks of memory cells; recovering data and recording a strike for blocks that fail the read process; in response to a particular block having a strike, performing an odd/even compare process during the erase process for the particular blocks having the strike such that such that the odd/even compare process passes if a number of NAND strings having memory cells connected to even word lines with different erase verify results than memory cells connected to odd word lines is greater than a defect test threshold; and retiring blocks from further use for storing host data that do not pass the odd/even compare process even if the block passes erase verification.

In an example implementation, the read process is performed immediately after performing the program process for a respective block. In another example, the read process is performed later in time and independent form the program process. In some embodiments, the program process is performed for blocks having a strike.

One embodiment includes a non-volatile storage apparatus, comprising: a non-volatile memory structure comprising a plurality of blocks of memory cells arranged in vertical NAND strings and a plurality of word lines including even word lines and odd word lines; and a control circuit connected to the non-volatile memory structure. The control circuit is configured to: receive a request to read data from a first block of the plurality of blocks of memory cells, perform a read process for reading the data from the first block such that the read process fails, recover the data and record a strike for the first block in response to the failed read process, in response to the strike, perform an erase process including performing an odd/even compare process during the erase process for the first block such that the odd/even compare process passes if a number of NAND strings having memory cells connected to even word lines with different erase verify results than memory cells connected to odd word lines is greater than a defect test threshold, add the first block to a block pool if the odd/even compare process passes and the erase process passes, retire the first block from storing host data if the odd/even compare process does not pass and the erase process passes, and retire the first block from storing host data if the erase process fails.

In one example implementation, the control circuit is configured to determine whether the first block has less than an upper limit of strikes; the control circuit is configured to perform the erase process including performing the odd/even compare process in response to determining that the first bock has less than the upper limit of strikes; and the control circuit is configured to retire the first block from storing host data in response to determining that the first bock does not have has less than the upper limit of strikes.

One embodiment includes an apparatus, comprising: a non-volatile memory structure comprising a plurality of blocks of memory cells, the plurality of blocks of memory cells comprises a first block of memory cells arranged in vertical NAND strings and a plurality of word lines including even word lines and odd word lines, each NAND string is connected to all of the plurality of word lines; and a control circuit connected to the non-volatile memory structure, the control circuit is configured to receive data, erase the first block and program the data to the first block after erasing the first block. If the first block has already experienced a failed read process, then the control circuitry is configured to erase the first block by: applying doses of an erase signal to the NAND strings, performing erase verify for the NAND strings between and after the doses of the erase signal including separately performing erase verify for memory cells connected to even word lines to generate an even result and performing erase verify for memory cells connected to odd word lines to generate an odd result, determining that erasing of the NAND strings erase verified successfully when a sum of a number of NAND strings that failed erase verify for memory cells connected to even word lines or failed erase verify for memory cells connected to odd word lines is below a first threshold, for each NAND string, comparing a last even result for the NAND strings to a last odd result for the NAND string, the last even result is the even result used to determine whether the respective NAND string erased verified successfully and was obtained prior to determining that the NAND strings erase verified successfully, the last odd result is the odd result used to determine whether the respective NAND string erase verified successfully and was obtained prior to determining that the NAND strings erase verified successfully, and determining whether the erasing of the NAND strings failed, despite determining that erasing of the NAND strings erase verified successfully, by determining whether a number of NAND strings that have the last even result different than the last odd result is greater than a second threshold. If the first block has not already experienced a failed read process, then the control circuit is configured to erase the first block without determining whether the erasing of the NAND strings failed by determining whether the number of NAND strings that have the last even result different than the last odd result is greater than the second threshold.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
    a non-volatile memory structure comprising a plurality of blocks of memory cells and a plurality of word lines, the plurality of word lines including even word lines and odd word lines, the memory cells are arranged in groups; and
    a control circuit connected to the non-volatile memory structure, the control circuit is configured to program data to a first block of the plurality of blocks after erasing the first block if erasing the first block was successful;
    the control circuit is configured to determine whether the erasing the first block was successful prior to the first block having experienced a failed read process by testing whether the first block has erase verified successfully;
    the control circuit is configured to determine whether the erasing the first block was successful after the first block experienced a failed read process by testing whether the first block has erase verified successfully and additionally by testing whether a number of groups having memory cells connected to even word lines in the first block that have a different erase verify result than memory cells connected to odd word lines in the first block is greater than a defect test threshold.

2. The non-volatile storage apparatus of claim 1, wherein:
    the first block includes memory cells arranged in vertical NAND strings; and
    the control circuit is configured to determine whether the erasing the first block was successful after the first block experienced a failed read process by:
        applying doses of an erase signal to the NAND strings,
        performing erase verify for the NAND strings between and after the doses of the erase signal including separately performing erase verify for memory cells connected to even word lines to generate an even result and performing erase verify for memory cells connected to odd word lines to generate an odd result,
        determining that erasing of the NAND strings erase verified successfully when a sum of a number of NAND strings that failed erase verify for memory cells connected to even word lines or failed erase verify for memory cells connected to odd word lines is below a first threshold,
        for each NAND string, comparing a last even result for the NAND strings to a last odd result for the NAND string, the last even result is the even result used to determine whether the respective NAND string erased verified successfully and was obtained prior to determining that the NAND strings erase verified successfully, the last odd result is the odd result used to determine whether the respective NAND string erase verified successfully and was obtained prior to determining that the NAND strings erase verified successfully, and determining whether the erasing of the NAND strings failed, despite determining that erasing of the NAND strings erase verified successfully, by determining whether a number of NAND strings that have the last even result different than the last odd result is greater than the defect test threshold.

3. The apparatus of claim 2, wherein:
    the first threshold is higher than the defect test threshold.

4. The apparatus of claim 2, wherein:
    the last even result is obtained after a last dose of the erase signal; and
    the last odd result is obtained after the last dose of the erase signal.

5. The apparatus of claim 2, wherein:
    the control circuit includes a first latch and a second latch;
    the control circuit is configured to store the even result in the first latch and store the odd result in the second latch after each dose of the erase signal;

the last even result is in the first latch when determining that erasing of the plurality of groups of connected memory cells erase verified successfully;

the last odd result is in the second latch when determining that erasing of the plurality of groups of connected memory cells erase verified successfully; and the control circuit is configured to compare the last even result for the NAND strings to the last odd result for the NAND string by comparing contents of the first latch to contents of the second latch.

6. The apparatus of claim 2, wherein:
the doses of the erase signal are voltage pulses.

7. The non-volatile storage apparatus of claim 1, wherein:
the plurality of blocks of memory cells comprises a first block of memory cells arranged in groups of connected memory cells; and the control circuit is configured to determine whether the erasing the first block was successful after the first block experienced a failed read process by:
applying doses of an erase signal to the groups,
performing erase verify for the groups between and after the doses of the erase signal including separately performing erase verify for memory cells connected to even word lines to generate an even result and performing erase verify for memory cells connected to odd word lines to generate an odd result,
determining that erasing of the plurality of groups of connected memory cells erase verified successfully when a sum of a number of groups that failed erase verify for memory cells connected to even word lines or failed erase verify for memory cells connected to odd word lines is below a first threshold,
for each group, comparing a last even result for the groups to a last odd result for the group, the last even result is the even result used to determine whether the respective group erased verified successfully and was obtained prior to determining that the groups erase verified successfully, the last odd result is the odd result used to determine whether the respective group erase verified successfully and was obtained prior to determining that the groups erase verified successfully, and
determining whether the erasing of the groups failed, despite determining that erasing of the groups erase verified successfully, by determining whether a number of groups that have the last even result different than the last odd result is greater than the defect test threshold.

8. The non-volatile storage apparatus of claim 1, wherein:
the control circuit is configured to retire the first block from storing host data in response to determining that the number of memory cells connected to even word lines in the first block that have a different erase verify result than memory cells connected to odd word lines in the first is greater than the defect test threshold.

9. The non-volatile storage apparatus of claim 1, wherein:
the control circuit is configured to retire the first block from storing host data in response to determining that the first block failed erasing of the first block.

10. The non-volatile storage apparatus of claim 1, wherein:
the control circuit is configured to retire the first block from storing host data in response to determining that the first block failed programming of the data to the first block.

11. The non-volatile storage apparatus of claim 1, wherein:
the control circuit is configured to perform a first read process to read the data from the first block immediately after programming the data to the first block; and
the control circuit is configured to recover the data and record a strike for the first block if the first block fails the first read process; and
the strike indicates that the first block experienced a failed read process.

12. The non-volatile storage apparatus of claim 11, wherein:
the control circuit is configured to re-program the recovered data to a new block if the first block fails the first read process.

13. A method of operating non-volatile storage, comprising:
performing an erase process followed by a program process to program blocks of memory cells arranged as NAND strings, each NAND string includes memory cells connected to even word lines and memory cells connected to odd word lines, the erase process comprises erasing followed by erase verification;
performing a read process to read from blocks of memory cells;
recovering data and recording a strike for one or more blocks that fail the read process;
in response to a particular block having a strike, performing an odd/even compare process during the erase process for the particular block having the strike such that the odd/even compare process passes if a number of NAND strings in the particular block with an erase verify result for its memory cells connected to the even word lines different from an erase verify result for its memory cells connected to the odd word lines is less than a defect test threshold; and
retiring blocks from further use for storing host data that do not pass the odd/even compare process even if the block passes erase verification.

14. The method of claim 13, wherein:
the read process is performed immediately after performing the program process for a respective block.

15. The method of claim 13, wherein:
the program process is performed for blocks having a strike.

16. The method of claim 14, wherein performing the erase process including performing the odd/even compare process during the erase process comprises:
applying doses of an erase signal to a plurality of NAND strings,
performing erase verify for the NAND strings between and after the doses of the erase signal including separately performing erase verify for memory cells connected to even word lines to generate an even result for each NAND string and performing erase verify for memory cells connected to odd word lines to generate an odd result for each NAND string,
determining that erasing of the NAND strings erase verified successfully when a sum of a number of NAND strings that failed erase verify for memory cells connected to even word lines or failed erase verify for memory cells connected to odd word lines is below a first threshold,
for each NAND string, comparing a last even result for the NAND strings with a last odd result for the NAND string, the last even result is an even result used to determine whether the respective NAND string erased verified successfully and was obtained prior to determining that the NAND strings erase verified successfully, the last odd result is an odd result used to determine whether the respective NAND string erase verified successfully and was obtained prior to determining that the NAND strings erase verified successfully, and determining whether the erasing of the NAND strings failed, despite determining that erasing of the NAND strings erase verified successfully, by determining whether a number of NAND strings that have the last even result different than the last odd result is greater than the defect test threshold.

17. A non-volatile storage apparatus, comprising:

a non-volatile memory structure comprising a plurality of blocks of memory cells arranged in vertical NAND strings and a plurality of word lines including even word lines and odd word lines, each NAND string includes memory cells connected to even word lines and memory cells connected to odd word lines; and a control circuit connected to the non-volatile memory structure, the control circuit is configured to:
  receive a request to read data from a first block of the plurality of blocks of memory cells,
  perform a read process for reading the data from the first block such that the read process fails,
  recover the data and record a strike for the first block in response to the failed read process,
  in response to the strike, perform an erase process including performing an odd/even compare process during the erase process for the first block such that the odd/even compare process passes if a number of NAND strings in the first block with an erase verify result for its memory cells connected to the even word lines different from an erase verify result for its memory cells connected to the odd word lines is less than a defect test threshold,
  add the first block to a block pool if the odd/even compare process passes and the erase process passes,
  retire the first block from storing host data if the odd/even compare process does not pass and the erase process passes, and
  retire the first block from storing host data if the erase process fails.

18. The non-volatile storage apparatus of claim 17, wherein:
  the control circuit is configured to determine whether the first block has less than an upper limit of strikes;
  the control circuit is configured to perform the erase process including performing the odd/even compare process in response to determining that the first block has less than the upper limit of strikes; and
  the control circuit is configured to retire the first block from storing host data in response to determining that the first bock does not have has less than the upper limit of strikes.

19. The non-volatile storage apparatus of claim 17, wherein:
  the control circuit is configured to relocate the recovered data to a different block of the plurality of blocks.

* * * * *